(12) United States Patent
Harada et al.

(10) Patent No.: US 7,807,537 B2
(45) Date of Patent: Oct. 5, 2010

(54) METHOD FOR FORMING SILICON OXIDE FILM AND FOR MANUFACTURING CAPACITOR AND SEMICONDUCTOR DEVICE

(75) Inventors: Yoshiko Harada, Kagoshima-ken (JP); Naotada Ogura, Kagoshima-ken (JP)

(73) Assignee: Yamaha Corporation, Shizuoka-Ken (JP)

( * ) Notice: Subject to any disclaimer, the term of this patent is extended or adjusted under 35 U.S.C. 154(b) by 874 days.

(21) Appl. No.: 11/686,225

(22) Filed: Mar. 14, 2007

(65) Prior Publication Data

US 2007/0218637 A1    Sep. 20, 2007

(30) Foreign Application Priority Data

Mar. 15, 2006    (JP) ............................. 2006-070738

(51) Int. Cl.
H01L 21/8234    (2006.01)
(52) U.S. Cl. ............... 438/275; 438/287; 257/E21.043
(58) Field of Classification Search ................ 438/287, 438/275; 257/E21.043
See application file for complete search history.

(56) References Cited

U.S. PATENT DOCUMENTS

| | | | | |
|---|---|---|---|---|
| 5,863,819 A | * | 1/1999 | Gonzalez | .................... 438/238 |
| 6,417,037 B1 | * | 7/2002 | Feng | .......................... 438/216 |
| 6,461,919 B1 | * | 10/2002 | Shibata | ....................... 438/275 |
| 2002/0084484 A1 | * | 7/2002 | Kurihara et al. | ............. 257/315 |
| 2003/0228735 A1 | * | 12/2003 | Nakamura et al. | .......... 438/279 |
| 2005/0029600 A1 | * | 2/2005 | Tsujikawa et al. | .......... 257/368 |
| 2005/0227439 A1 | * | 10/2005 | Adam et al. | ................ 438/275 |

FOREIGN PATENT DOCUMENTS

JP        06-151829        5/1994

* cited by examiner

*Primary Examiner*—Matthew Smith
*Assistant Examiner*—John M Parker
(74) *Attorney, Agent, or Firm*—Dickstein Shapiro LLP

(57) ABSTRACT

After forming a silicon nitride film 14 on a silicon oxide film 12 covering one main surface of a semiconductor substrate 10 by a CVD method, argon ions $Ar^+$ are doped to a part (where oxidation speed should be reduced) of the silicon nitride film 14 by an ion doping process using a resist layer as a mask in a condition of acceleration voltage at 100 keV and a dose amount of $5 \times 10^{15}$ inos/cm². Thereafter, by performing a thermal oxidation process to the silicon nitride film 14, a thin silicon oxide film 18a is formed in a non-ion doped part and a thick silicon oxide film 18b is formed in an ion doped part. This method for forming silicon oxide films can be applied to a method for manufacturing capacitors of a MOS type IC, etc. Moreover, a silicon oxynitride film can be used instead of the silicon nitride film.

8 Claims, 15 Drawing Sheets

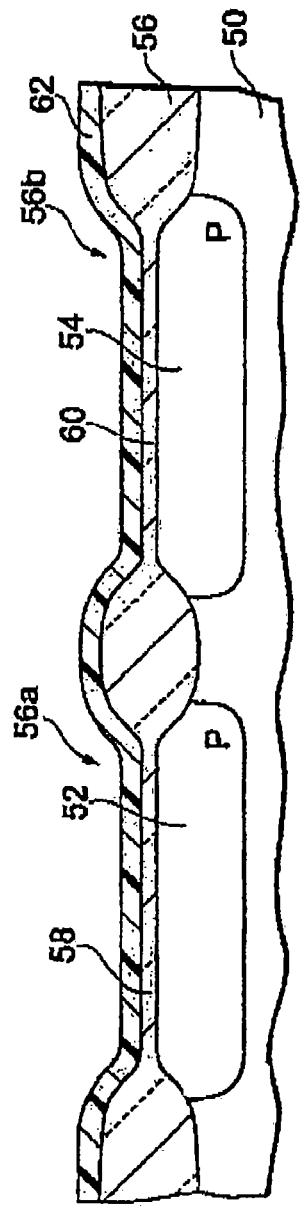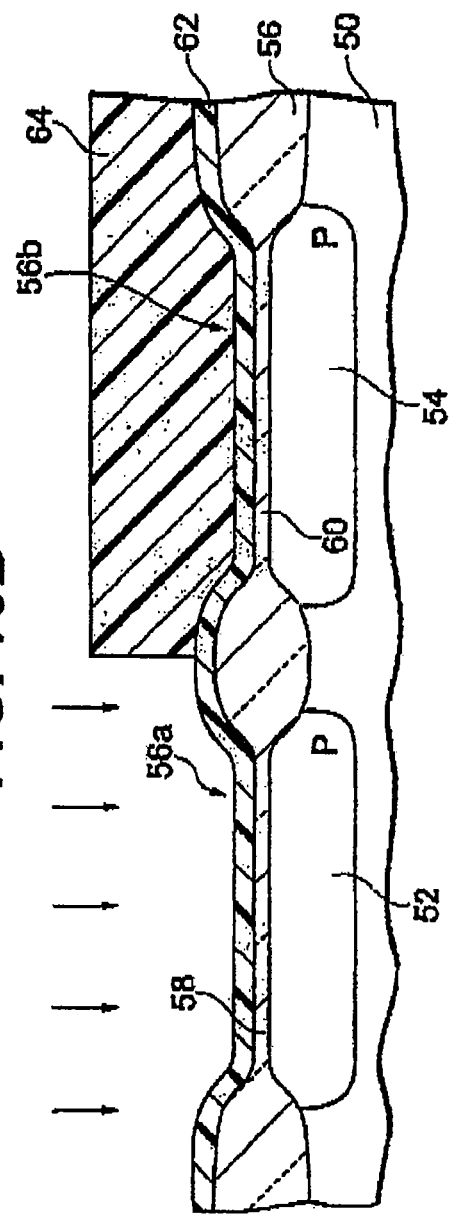

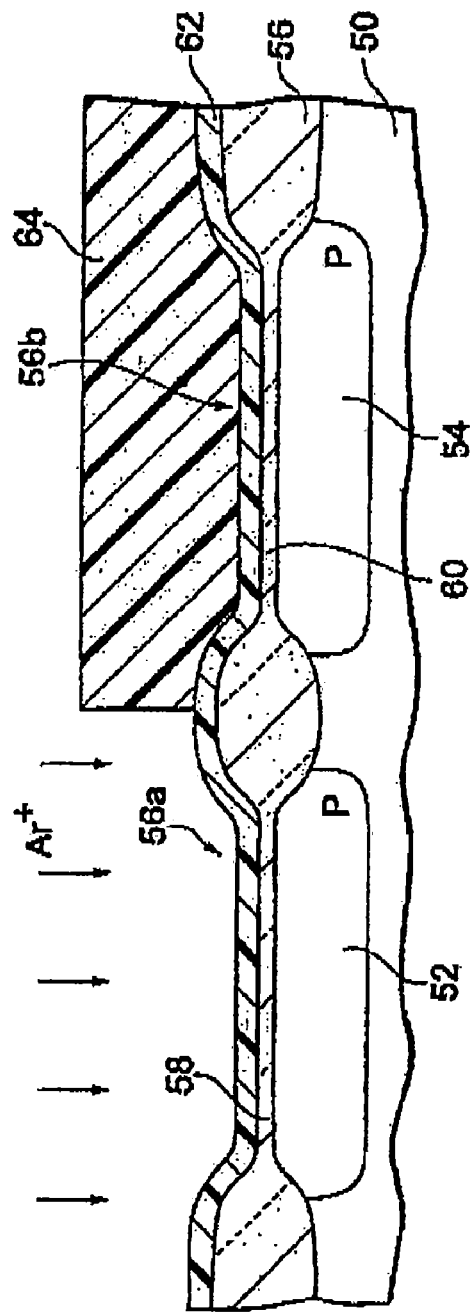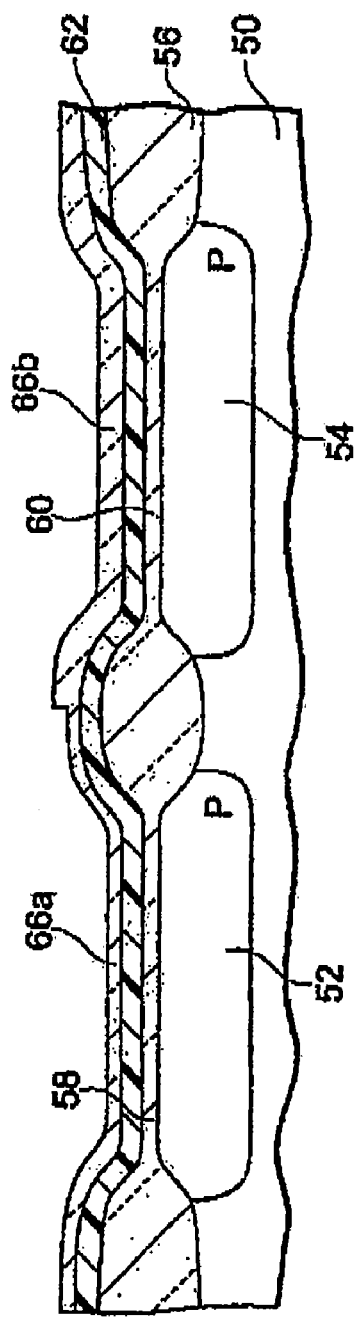

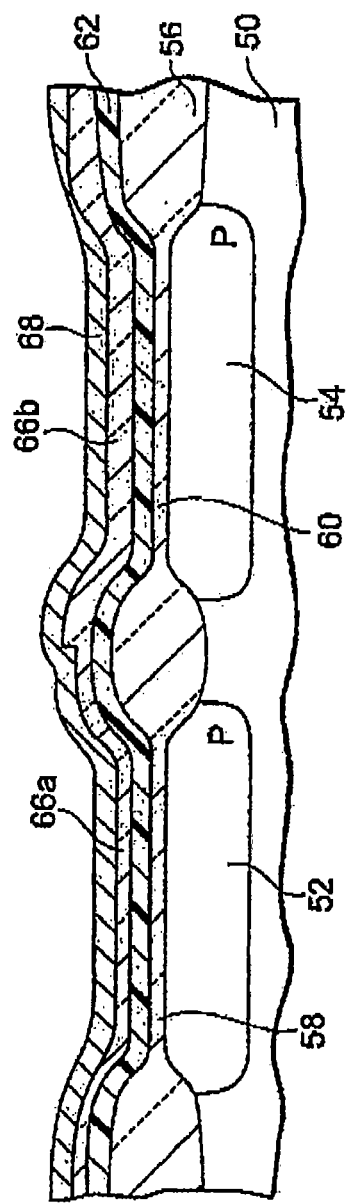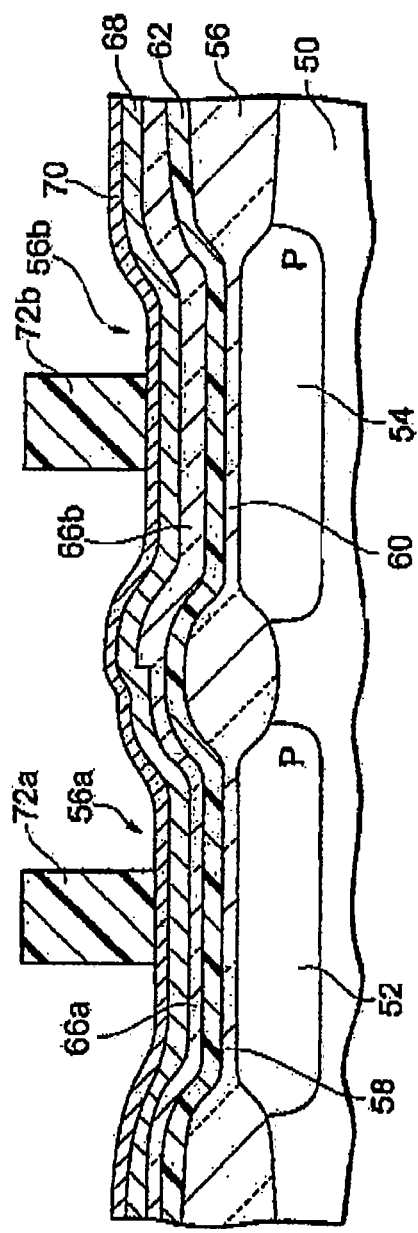

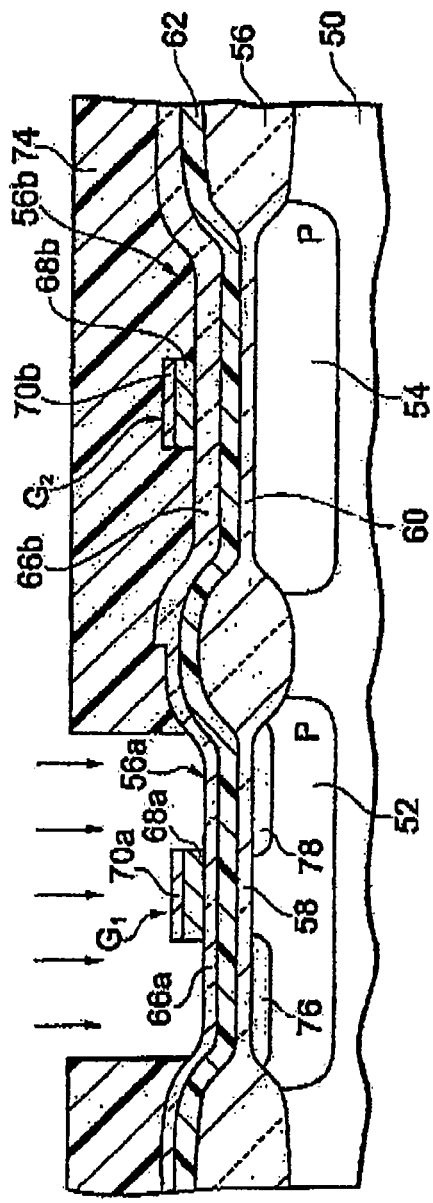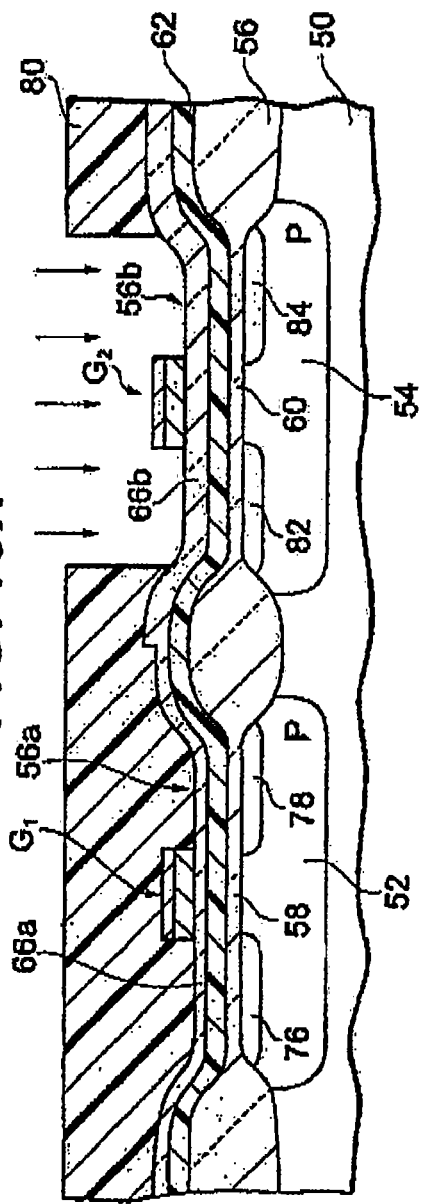

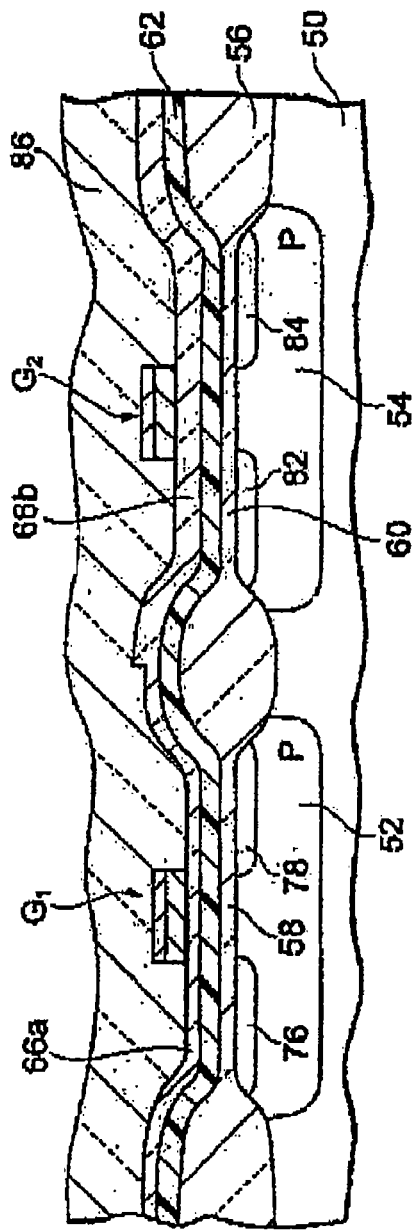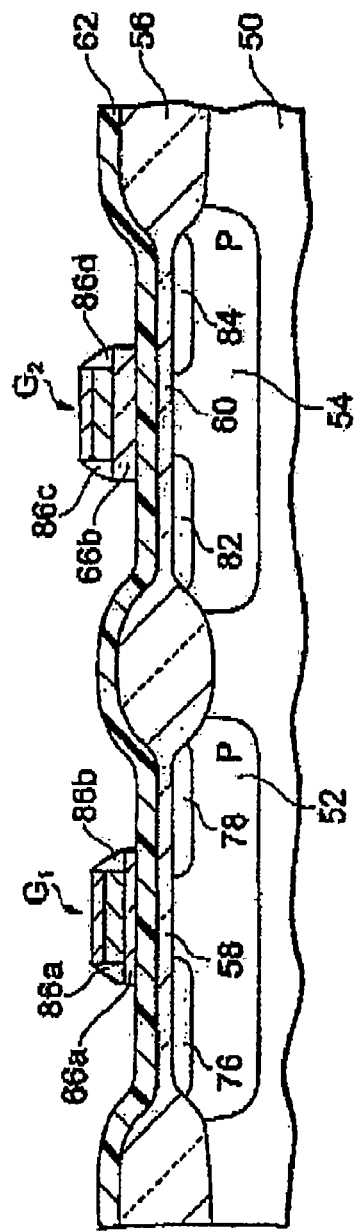

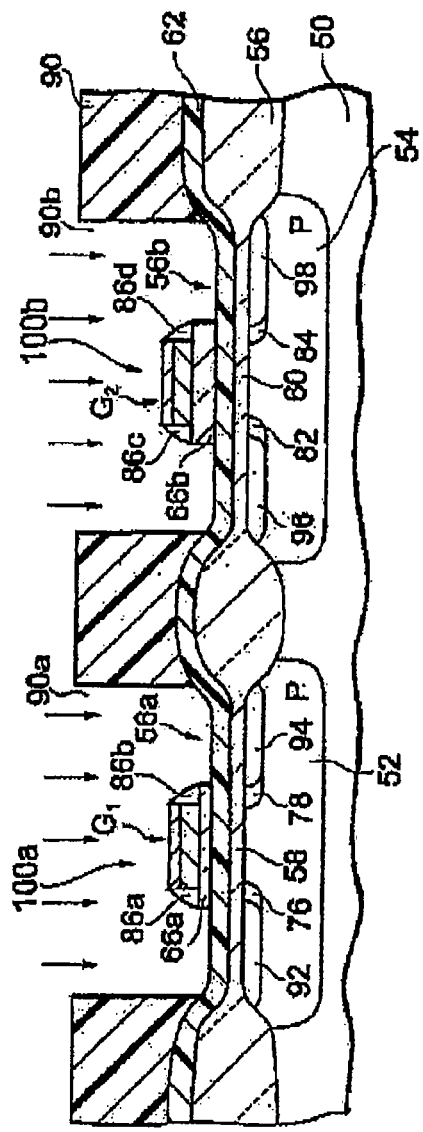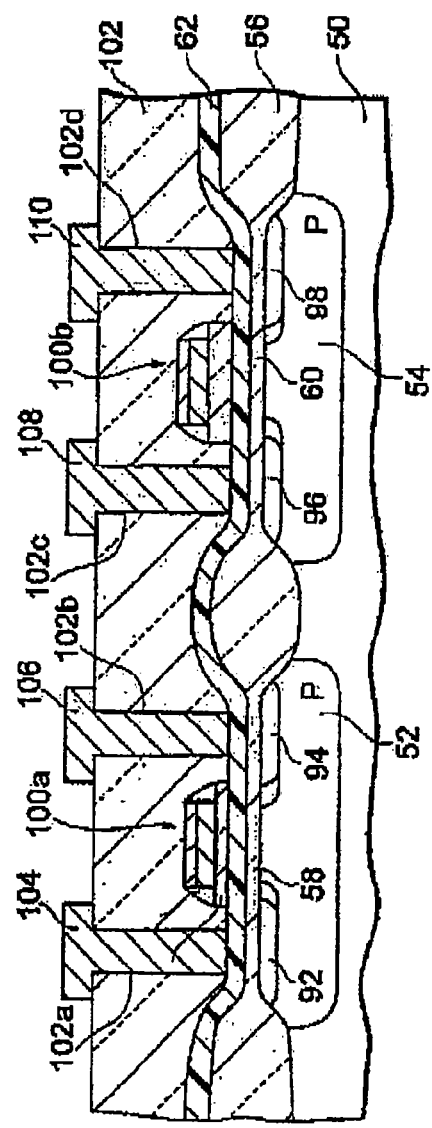

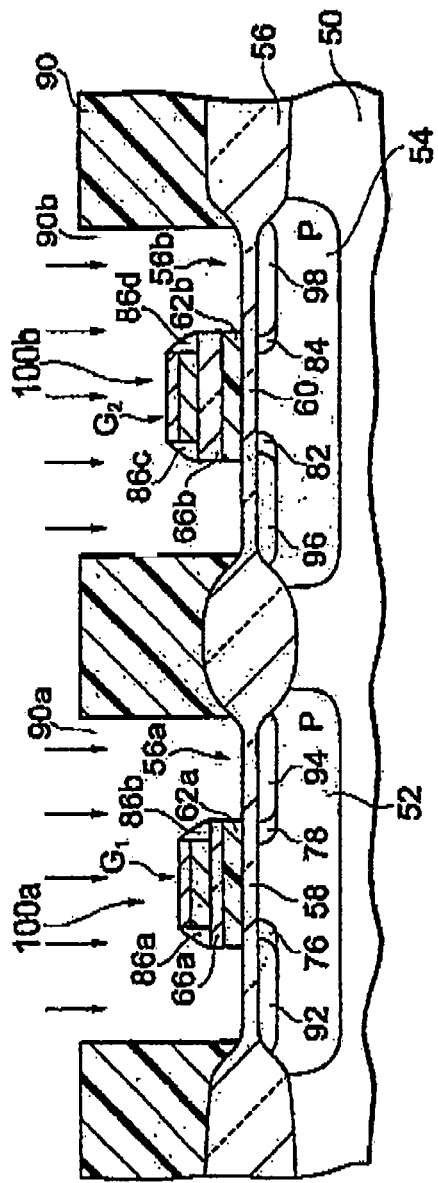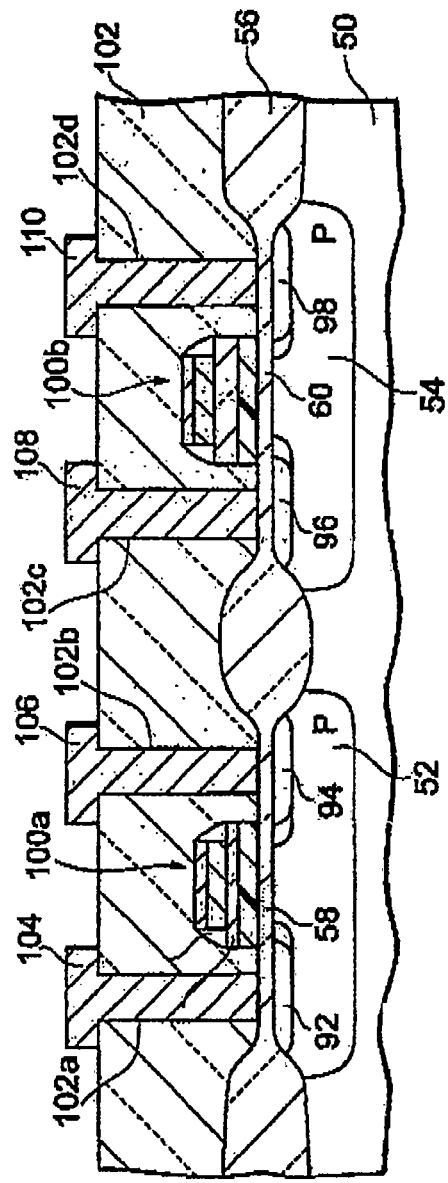

METHOD FOR FORMING SILICON OXIDE FILM AND FOR MANUFACTURING CAPACITOR AND SEMICONDUCTOR DEVICE

CROSS REFERENCE TO RELATED APPLICATION

This application is based on Japanese Patent Application 2006-070738, filed on Mar. 15, 2006, the entire contents of which are incorporated herein by reference.

BACKGROUND OF THE INVENTION

A) Field of the Invention

This invention relates to a method for forming a plurality of silicon oxide films having different thicknesses on a silicon nitride film or on a silicon oxynitride film and to a method of manufacturing capacitors and a semiconductor device using that method.

B) Description of the Related Art

It is known that leaking out of boron atoms via a silicon oxynitride film is restrained by doping nitride ions to the silicon oxynitride film formed by covering one primary surface of a silicon substrate (for example, refer to Japanese Laid-Open Patent NO. Hei06-151829 which is hereinafter referred as the patent document 1).

According to the above conventional technique, density of nitrogen in a silicon oxynitride film can be increased by doping nitrogen ions; therefore, it can be avoided that boron is doped in a surface of a silicon substrate from a boron-doped poly-silicon layer via the silicon oxynitride film. However, the patent document 1 does not teach a technique for forming a silicon oxide film by performing a thermal oxidation process to a silicon oxynitride film or to a silicon nitride film.

The inventors of the present invention have tested to form a plurality of silicon oxide films having different thicknesses on a silicon nitride film by using a method for forming a silicon oxide film by performing a thermal oxidation process to a silicon nitride film. FIG. 22 to FIG. 26 show the method for forming silicon oxide films on a silicon nitride film according to the research of the inventors.

At a step shown in FIG. 22, after forming a silicon oxide film (a pad oxide film for stress relaxation) 2 on one primary surface of a silicon substrate 1 by a thermal oxidation process, a silicon nitride film 3 is formed on the silicon oxide film 2 by a chemical vapor deposition (CVD) method. Thereafter, at a step shown in FIG. 23, a silicon oxide film 4 is formed on the silicon nitride film 3 by performing a thermal oxidation process to the silicon nitride film 3.

At a step shown in FIG. 24, a resist layer 5 is formed on a part 4a of the silicon oxide film 4 by a photolithography process. Then, the silicon oxide film 4 is selectively removed by a wet-etching process with the resist layer 5 as a mask to remain the part 4a of the silicon oxide film 4 in a patter corresponding to the resist layer 5. Thereafter, at a step shown in FIG. 25, the resist layer 5 is removed by an ashing process, etc.

At a step shown in FIG. 26, the thermal oxidation process is performed to the silicon nitride film 3 again. As a result, a thick silicon oxide film 4a and a thin silicon oxide film 4b are formed on the silicon nitride film 3. Further, it is possible to make a thickness of the silicon oxide film 4b closer to a thickness of the silicon oxide film 4a at the step shown in FIG. 26 by etching the silicon oxide film 4 to remain a portion with a predetermined thickness excluding the part 4a at the step shown in FIG. 24.

According to the method for forming a silicon oxide film explained with reference to FIG. 22 to FIG. 26, it is possible to form a plurality of silicon oxide films having different thicknesses on a silicon nitride film. However, it is difficult to control the thickness of the silicon oxide film 4b precisely because a wet-etching process is not suited for controlling a film thickness, and it takes a longer process time because a plurality of thermal oxidation processes are necessary.

SUMMARY OF THE INVENTION

It is an object of the present invention to provide a method for forming silicon oxide films that can easily and precisely form a plurality of silicon oxide films on a silicon nitride film or on a silicon oxynitride film.

Moreover, it is another object of the present invention to provide a method for manufacturing capacitors using the method for forming silicon oxide films according to the present invention.

Moreover, it is still another object of the present invention to provide a method for manufacturing a semiconductor device such as a MOS-type transistor using the method for forming silicon oxide films according to the present invention.

According to one aspect of the present invention, there is provided a method for forming silicon oxide films, comprising the steps of: (a) preparing a substrate; (b) forming a silicon nitride film or a silicon oxynitride film covering one main surface of the substrate; (c) forming an ion-doping mask on the silicon nitride film or the silicon oxynitride film in accordance with a predetermined pattern; (d) doping an impurity ion for changing oxidation speed to the silicon nitride film or the silicon oxynitride film by a selecting ion doping process by using the ion doping mask; (e) removing the ion-doping mask; and (f) performing a thermal oxidation process to the silicon nitride film or the silicon oxynitride film so as to form a first silicon oxide film in a part of the silicon nitride film or the silicon oxynitride film where the impurity ion is doped and to form a second silicon oxide film in a part of the silicon nitride film or the silicon oxynitride film where the impurity ion is not doped with a thickness different from a thickness of the first silicon oxide film.

According to the present invention, because the first and the second silicon oxide films having different thicknesses are formed by the thermal oxidation process after selectively doping the impurity ion for changing oxidation speed to the silicon nitride film or the silicon oxynitride film, plurality kinds of silicon oxide films having different thicknesses can be easily formed by one thermal process by properly setting a doping amount of the impurity ion. Moreover, because it is unnecessary to use a wet-etching process, which is hard to be controlled precisely, a thickness of a silicon oxide film can be controlled precisely only by an oxidation condition.

In the above-described method of the present invention, the selective ion doping process at the step (d) can use an inert atom or a nitride ion as the impurity ion for changing oxidation speed, and the first silicon oxide film can be formed to be thinner than the second silicon oxide film at the step (f).

According to another aspect of the present invention, there is provided a method for manufacturing capacitors, comprising the steps of: (a) preparing a substrate having an insulating surface; (b) forming a first conductive material layer on the insulating surface of the substrate; (c) forming a silicon nitride film or a silicon oxynitride film on the conductive material layer; (d) forming an ion-doping mask on the silicon nitride film or the silicon oxynitride film in accordance with a predetermined pattern; (e) doping an impurity ion for changing oxidation speed to the silicon nitride film or the silicon oxynitride film by a selecting ion doping process by using the ion doping mask, (f) removing the ion-doping mask; (g) performing a thermal oxidation process to the silicon nitride film or the silicon oxynitride film so as to form a first silicon oxide film in a part of the silicon nitride film or the silicon oxynitride film where the impurity ion is doped and to form a second silicon oxide film in a part of the silicon nitride film or the silicon oxynitride film where the impurity ion is not doped with a thickness different from a thickness of the first silicon oxide film; (h) forming a second conductive material layer covering the first and the second silicon oxide films; (i) patterning a first lamination including the silicon nitride film or the silicon oxynitride film, the first silicon oxide film and the second conductive material layer in accordance with a pattern of a first capacitor pattern to form a capacitance insulating film of a first capacitor with a first remaining part of the silicon nitride film or the silicon oxynitride film and a remaining part of the first silicon oxide film and to form an upper electrode layer of the first capacitor with a first remaining part of the second conductive material layer, and patterning a second lamination including the silicon nitride film or the silicon oxynitride film, the second silicon oxide film and the second conductive material layer in accordance with a pattern of a second capacitor pattern to form a capacitance insulating film of a second capacitor with a second remaining part of the silicon nitride film or the silicon oxynitride film and a remaining part of the second silicon oxide film and to form an upper electrode layer of the second capacitor with a second remaining part of the second conductive material layer; and (j) patterning the first conductive material layer below the upper electrode layer of the first capacitor to form a lower electrode layer of the first capacitor with a first remaining part of the first conductive material layer, and patterning the first conductive material layer below the upper electrode layer of the second capacitor to form a lower electrode layer of the second capacitor with a second remaining part of the first conductive material layer.

According to the present invention, the first and the second capacitors having different capacitance can be easily and precisely formed because the first and the second silicon oxide films having different thicknesses are formed on the silicon nitride film or the silicon oxynitride film by the method for forming silicon oxide films according to the present invention, thereafter the capacitance insulating film of the first capacitor is formed by patterning the lamination of the silicon nitride film or the silicon oxynitride film and the first silicon oxide film, and the capacitance insulating film of the second capacitor is formed by patterning the lamination of the silicon nitride film or the silicon oxynitride film and the second silicon oxide film.

The method for manufacturing capacitors according to the present invention may further comprises the step of (k) forming a third silicon oxide film on the first conductive material layer between the steps (b) and (c), and the step (i) may pattern the third silicon oxide film together with the first lamination layer in accordance with the first capacitor pattern to add a first remaining part of the third silicon oxide film under the first remaining part of the silicon nitride film or the silicon oxynitride film in the capacitance insulating film of the first capacitor, and pattern the third silicon oxide film together with the second lamination layer in accordance with the second capacitor pattern to add a second remaining part of the third silicon oxide film under the second remaining part of the silicon nitride film or the silicon oxynitride film in the capacitance insulating film of the second capacitor. By that, each of the capacitance insulating films of the first and the second capacitors has a symmetrical structure wherein the silicon oxide films enclose the silicon nitride film or the silicon oxynitride film from a top and a bottom; therefore, stability of capacitance characteristics will be improved.

According to still another aspect of the present invention, there is provided a method for manufacturing a semiconductor device, comprising the steps of: (a) preparing a semiconductor substrate, on one main surface of which a field insulating film having a first and a second element holes, wherein a semiconductor parts inside the first and the second element holes have same conductive type or different conductive types from each other; (b) forming a first and a second insulating thin films covering the semiconductor parts of the first and the second element holes respectively; (c) forming a silicon nitride film or a silicon oxynitride film covering the first and the second insulating thin films on the field insulating film; (d) forming an ion-doping mask not covering a part of the silicon nitride film or the silicon oxynitride film corresponding to the first element hole but covering a part of the silicon nitride film or the silicon oxynitride film corresponding to the second element hole; (e) doping an impurity ion for changing oxidation speed to the part of the silicon nitride film or the silicon oxynitride film corresponding to the first element hole by a selecting ion doping process by using the ion doping mask; (f) removing the ion-doping mask; (g) performing a thermal oxidation process to the silicon nitride film or the silicon oxynitride film so as to form a first silicon oxide film in the part of the silicon nitride film or the silicon oxynitride film corresponding to the first element hole and to form a second silicon oxide film in the part of the silicon nitride film or the silicon oxynitride film corresponding to the second element hole with a thickness different from a thickness of the first silicon oxide film; (h) forming a conductive material layer covering the first and the second silicon oxide films; (i) patterning the conductive material layer inside the first element hole in accordance with a first gate electrode pattern to form a first gate electrode layer composed of a first remaining part of the conductive material layer, and patterning the conductive material layer inside the second element hole in accordance with a second gate electrode pattern to form a second gate electrode layer composed of a second remaining part of the conductive material layer; (j) selectively removing the first and the second silicon oxide films by a dry-etching process using the first and the second gate electrode layers as masks so as to remain a part of the first silicon oxide film under the first gate electrode layer and to remain a part of the second silicon oxide film under the second gate electrode layer; and (k) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first source region on one side of the first gate electrode layer and to form a first drain region on another side of the first gate electrode layer, and doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second source region on one side of the second gate electrode layer and to form a second drain region on another side of the second gate electrode layer.

According to the present invention, the first and the second gate insulating films can be easily and precisely formed because the first and the second silicon oxide films having different thicknesses are formed in the pars of the silicon nitride film or the silicon oxynitride film corresponding to the first and the second element holes by the method for forming silicon oxide films according to the present invention, thereafter the part of the first silicon oxide film is remained under the first gate electrode layer and the part of the second silicon oxide film is remained under the second gate electrode layer by the dry-etching process using the first and the second gate electrode layers as masks. Moreover, the silicon nitride film or the silicon oxynitride film can be remained in the part except wiring connecting holes as water preventing films and therefore reverse of a conductive type and increase in current leak can be restrained because the first source region and the first drain region are formed by performing the ion-doping via the silicon nitride film or the silicon oxynitride film and the first insulating film, and the second source region and the second drain region are formed by performing the ion-doping via the silicon nitride film or the silicon oxynitride film and the second insulating film.

The method for manufacturing a semiconductor device according to the present invention may further comprises the steps of: (l) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first low-concentration source region and a first low-concentration drain region respectively on one side and another side of the first gate electrode layer between the steps (j) and (k), the first low-concentration source region having lower impurity concentration than the first source region and the first low-concentration drain region having lower impurity concentration than the first drain region; (m) doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second low-concentration source region and a second low-concentration drain region respectively on one side and another side of the second gate electrode layer between the steps (j) and (k), the second low-concentration source region having lower impurity concentration than the second source region and the second low-concentration drain region having lower impurity concentration than the second drain region; (n) forming an insulating film covering the first and the second gate electrode films on the first and the second silicon oxide films; and (o) etching back the insulating film to form a first and a second side spacers respectively composed of a first and a second remaining parts of the insulating film on the one side and another side of the first gate electrode layer and to form a third and a fourth side spacers respectively composed of a third and a fourth remaining parts of the insulating film on the one side and another side of the second gate electrode layer, and the dry-etching in the step (j) may be executed after the step (o), and the step (k) may further use the first and the second side spacers as masks for the ion doping to form the first source region and the first drain region and further use the third and the fourth side spacers as masks for the ion doping to form the second source region and the second drain region. By that, MOS type transistors each having a lightly doped drain (LDD) structure can be obtained inside the first and the second element holes. Moreover, the dry-etching process for selectively removing the first and the second silicon oxide films can be executed continuously right after the etching back of the insulating film for forming the first to the fourth side spacers; therefore, the process is very easy because the dry-etching process can be executed at once by using the silicon oxide films as insulating films.

According to further aspect of the present invention, there is provided a method for manufacturing a semiconductor device, comprising the steps of: (a) preparing a semiconductor substrate, on one main surface of which a field insulating film having a first and a second element holes, wherein a semiconductor parts inside the first and the second element holes have same conductive type or different conductive types from each other; (b) forming a first and a second insulating thin films covering the semiconductor parts of the first and the second element holes respectively; (c) forming a silicon nitride film or a silicon oxynitride film covering the first and the second insulating thin films on the field insulating film; (d) forming an ion-doping mask not covering a part of the silicon nitride film or the silicon oxynitride film corresponding to the first element hole but covering a part of the silicon nitride film or the silicon oxynitride film corresponding to the second element hole; (e) doping an impurity ion for changing oxidation speed to the part of the silicon nitride film or the silicon oxynitride film corresponding to the first element hole by a selecting ion doping process by using the ion doping mask; (f) removing the ion-doping mask; (g) performing a thermal oxidation process to the silicon nitride film or the silicon oxynitride film so as to form a first silicon oxide film in the part of the silicon nitride film or the silicon oxynitride film corresponding to the first element hole and to form a second silicon oxide film in the part of the silicon nitride film or the silicon oxynitride film corresponding to the second element hole with a thickness different from a thickness of the first silicon oxide film; (h) forming a conductive material layer covering the first and the second silicon oxide films; (i) patterning the conductive material layer inside the first element hole in accordance with a first gate electrode pattern to form a first gate electrode layer composed of a first remaining part of the conductive material layer, and patterning the conductive material layer inside the second element hole in accordance with a second gate electrode pattern to form a second gate electrode layer composed of a second remaining part of the conductive material layer; (j) selectively removing a first lamination layer including the silicon nitride film or the silicon oxynitride film and the first silicon oxide film and a second lamination layer including the silicon nitride film or the silicon oxynitride film and the second silicon oxide film by a dry-etching process using the first and the second gate electrode layers as masks so as to remain a part of the first lamination layer under the first gate electrode layer and to remain a part of the second lamination layer under the second gate electrode layer; and (k) doping an impurity defining a conductive type that is opposite of a conductive type of the semiconductor part of the first element hole to the first element hole via the first insulating thin film by using the first gate electrode layer as a mask to form a first source region on one side of the first gate electrode layer and to form a first drain region on another side of the first gate electrode layer, and doping an impurity defining a conductive type that is opposite of a conductive type of the semiconductor part of the second element hole to the semiconductor part of the second element hole via the second insulating thin film by using the second gate electrode layer as a mask to form a second source region on one side of the second gate electrode layer and to form a second drain region on another side of the second gate electrode layer.

According to the present invention, the first and the second gate insulating films can be easily and precisely formed because the first and the second silicon oxide films having different thicknesses are formed in the pars of the silicon nitride film or the silicon oxynitride film corresponding to the first and the second element holes by the method for forming silicon oxide films according to the present invention, thereafter the part of the first silicon oxide film is remained under the first gate electrode layer and the part of the second silicon oxide film is remained under the second gate electrode layer by the dry-etching process for selectively removing the first lamination layer including the silicon nitride film or the silicon oxynitride film and the first silicon oxide film and the second lamination layer including the silicon nitride film or the silicon oxynitride film and the second oxide film by using the first and the second gate electrode layers as masks. Moreover, the first source region and the first drain region are formed by performing the ion-doping via the first insulating thin film, and the second source region and the second drain region are formed by performing the ion-doping via the second insulating thin film; therefore, acceleration voltage for doping the ion impurity can be lowered and charge up damage can be reduced.

The method for manufacturing a semiconductor device according to the present invention may further comprises the steps of: (l) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first low-concentration source region and a first low-concentration drain region respectively on one side and another side of the first gate electrode layer between the steps (j) and (k), the first low-concentration source region having lower impurity concentration than the first source region and the first low-concentration drain region having lower impurity concentration than the first drain region; (m) doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second low-concentration source region and a second low-concentration drain region respectively on one side and another side of the second gate electrode layer between the steps (j) and (k), the second low-concentration source region having lower impurity concentration than the second source region and the second low-concentration drain region having lower impurity concentration than the second drain region; (n) forming an insulating film covering the first and the second gate electrode films on the first and the second silicon oxide films; and (o) etching back the insulating film to form a first and a second side spacers respectively composed of a first and a second remaining parts of the insulating film on the one side and another side of the first gate electrode layer and to form a third and a fourth side spacers respectively composed of a third and a fourth remaining parts of the insulating film on the one side and another side of the second gate electrode layer, and the dry-etching in the step (j) may be executed after the step (o), and the step (k) may further use the first and the second side spacers as masks for the ion doping to form the first source region and the first drain region and further use the third and the fourth side spacers as masks for the ion doping to form the second source region and the second drain region. By that, MOS type transistors each having a lightly doped drain (LDD) structure can be obtained inside the first and the second element holes. Moreover, the dry-etching process for selectively removing the first and the second silicon oxide films can be executed continuously right after the etching back of the insulating film for forming the first to the fourth side spacers; therefore, the process is very easy because, by using the silicon oxide films as insulating films, the first silicon oxide film in the first lamination layer and the second silicon oxide film in the second lamination layer can be removed selectively and continuously right after that by changing etching gas, etc., the silicon nitride film or the silicon oxynitride film in the first and the second lamination layers can be selectively removed.

According to the present invention, the impurity ion for changing oxidation speed is selectively doped to the silicon nitride film or the silicon oxynitride film and thereafter the thermal oxidation process is performed to the silicon nitride film or the silicon oxynitride film to form the first and the second silicon oxide films having the different thicknesses; therefore, plurality kinds of silicon oxide films differentiating their thicknesses can be easily and precisely formed, and a plurality of capacitors differentiating their capacitances, a plurality of MOS type transistors differentiating thicknesses of gate insulating films, etc. can be manufactured at a low cost.

BRIEF DESCRIPTION OF THE DRAWINGS

FIGS. 15A and 15B are cross sectional view respectively showing a silicon nitride film forming process and an ion doping process in a method for manufacturing a MOS type IC according to a third embodiment of the present invention.

FIGS. 16C and 16D are cross sectional views respectively showing an ion doping process and a thermal oxidation process following the process shown in FIG. 15B.

FIGS. 17E and 17F are cross sectional views respectively showing a poly-silicon layer forming process and a WSi layer forming process following the process shown in FIG. 16D.

FIGS. 18G and 18H are cross sectional views respectively showing an ion doping process via a thin silicon oxide film and an ion doping process via a thick silicon oxide film following the process shown in FIG. 17F.

FIGS. 19I and 19J are cross sectional views respectively showing an insulating film forming process and a side spacer forming process following the process shown in FIG. 18H.

FIGS. 20K and 20L are cross sectional views respectively showing an ion doping process and a wiring layer forming process following the process shown in FIG. 19J.

FIGS. 21A and 21B are cross sectional views respectively showing an ion doping process and a wiring layer forming process in a modified example of the method for manufacturing a MOS type IC according to the third embodiment of the present invention.

DETAILED DESCRIPTION OF THE PREFERRED EMBODIMENTS

Figure 1:
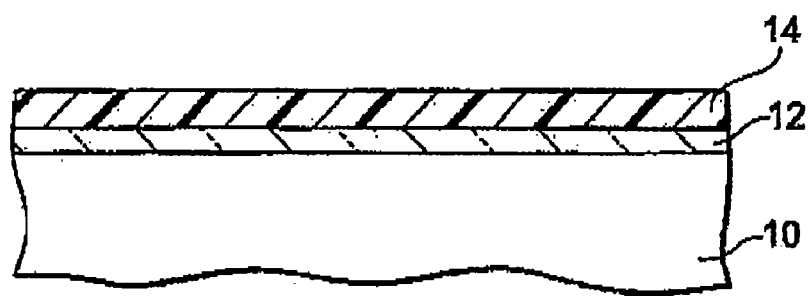
FIG. 1 is a cross sectional view showing a silicon nitride film forming process in a method for forming silicon oxide films according to a first embodiment of the present invention.
Figure 2:
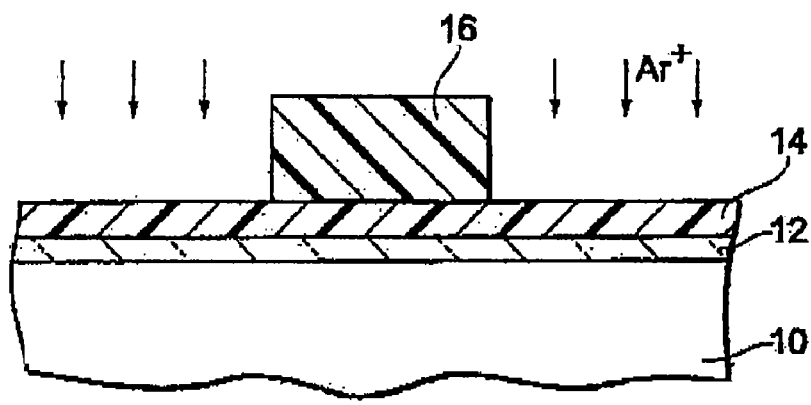
FIG. 2 is a cross sectional view showing an ion doping process following the process shown in FIG. 1.
Figure 3:
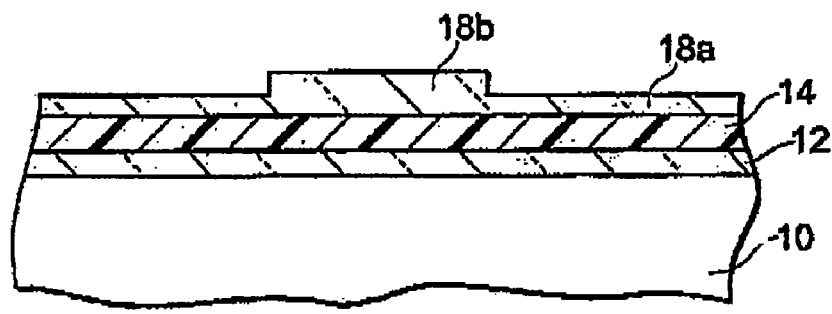
FIG. 3 is a cross sectional view showing a thermal oxidation process following the process shown in FIG. 2.

FIG. 1 to FIG. 3 show a method for forming silicon oxide films according to a first embodiment of the present invention. Processes (1) to (3) respectively corresponding to FIG. 1 to FIG. 3 will be described in the order.

In the process (1) shown in FIG. 1, for example, a silicon oxide film 12 is formed on one main surface of a semiconductor substrate 10 made of a single crystal silicon. The silicon oxide film 12 is used a pad oxide film for stress relaxation and may have a thickness of about 30 to 50 nm. A silicon nitride film 14 is formed on the silicon oxide film 12 by a chemical vapor deposition (CVD) method. A deposition condition of the silicon nitride film 14 is, for example, that supplied gas are $NH_3$ (900 slm) and $SiH_2Cl_2$ (90 sccm), temperature is at 770 degree Celsius, a process time is 35 minutes and thickness is 100 nm. Further, the silicon nitride film 14 may be formed by a sputter method, etc.

In the process (2) shown in FIG. 2, a resist layer 16 is formed on the silicon nitride film 14 in accordance with a predetermined pattern by a photolithography process. The resist layer 16 is used as an ion doping mask and formed to cover a part of the silicon nitride film 14 where oxidation speed should not be reduced and to expose a part of the silicon nitride film 14 where the oxidation speed should be reduced.

Next, argon ions $Ar^+$ are doped to the exposed part of the silicon nitride film 14 by an ion doping process using the resist layer 16 as a mask. An ion doping condition for the process is, for example, at acceleration voltage of 100 keV and a dose amount of $5 \times 10^{15}$ inos/$cm^2$.

In the process (3) shown in FIG. 3, a thin silicon oxide film 18a and a thick silicon oxide film 18b are simultaneously formed on the silicon nitride film 14 by performing a thermal oxidation process to the silicon nitride film 14 after removing the resist layer 16. A condition of the thermal oxidation is, for example, at a temperature of 950 degrees Celsius, for 9 minutes and with supplied gas of $H_2/O_2=6/3.5$. The silicon oxide film 18a is formed on the exposed part of the silicon nitride film 14 in the process shown in FIG. 2 with having a thickness thinner than the silicon oxide film 18b because the oxidation speed in the exposed part has been reduced by doping of the argon ions $Ar^+$. When the argon ions $Ar^+$ are doped in the above-described condition, the thickness of the silicon oxide film 18a can be about ⅓ to ¼ of the thickness of the silicon oxide film 18b.

The following TABLE 1 shows a condition that the thickness of the silicon oxide film depends on a dose amount of the argon ions $Ar^+$. In order to obtain the data in TABLE 1, silicon wafers (the substrates 10) No. 1 to No. 6, on each surface of which the silicon nitride film 14 is formed via the silicon oxide film 12 as shown in FIG. 1, are prepared. The argon ions $Ar^+$ are not doped to the silicon nitride films 14 of the wafers No. 1 and No. 2, and the argon ions $Ar^+$ are doped to the silicon nitride films 14 of the wafers No. 3 and No. 6 at acceleration voltage of 100 keV with changing the dose amount as shown in TABLE 1. Thereafter, the thermal oxidation process is performed to the silicon nitride films 14 of the wafers No. 1 to No. 6. Then, the thickness of the silicon oxide film of each wafer is measured.

TABLE 1

| | WAFER NO. | | | | | |
| --- | --- | --- | --- | --- | --- | --- |
| | 1 | 2 | 3 | 4 | 5 | 6 |
| DOSE AMOUNT [ions/cm2] | 0 | 0 | $1 \times 10^{14}$ | $5 \times 10^{14}$ | $1 \times 10^{15}$ | $5 \times 10^{15}$ |
| OXIDATION FILM THICKNESS [Å] | 39.76 | 39.83 | 40.49 | 38.66 | 33.87 | 11.69 |

Figure 4:
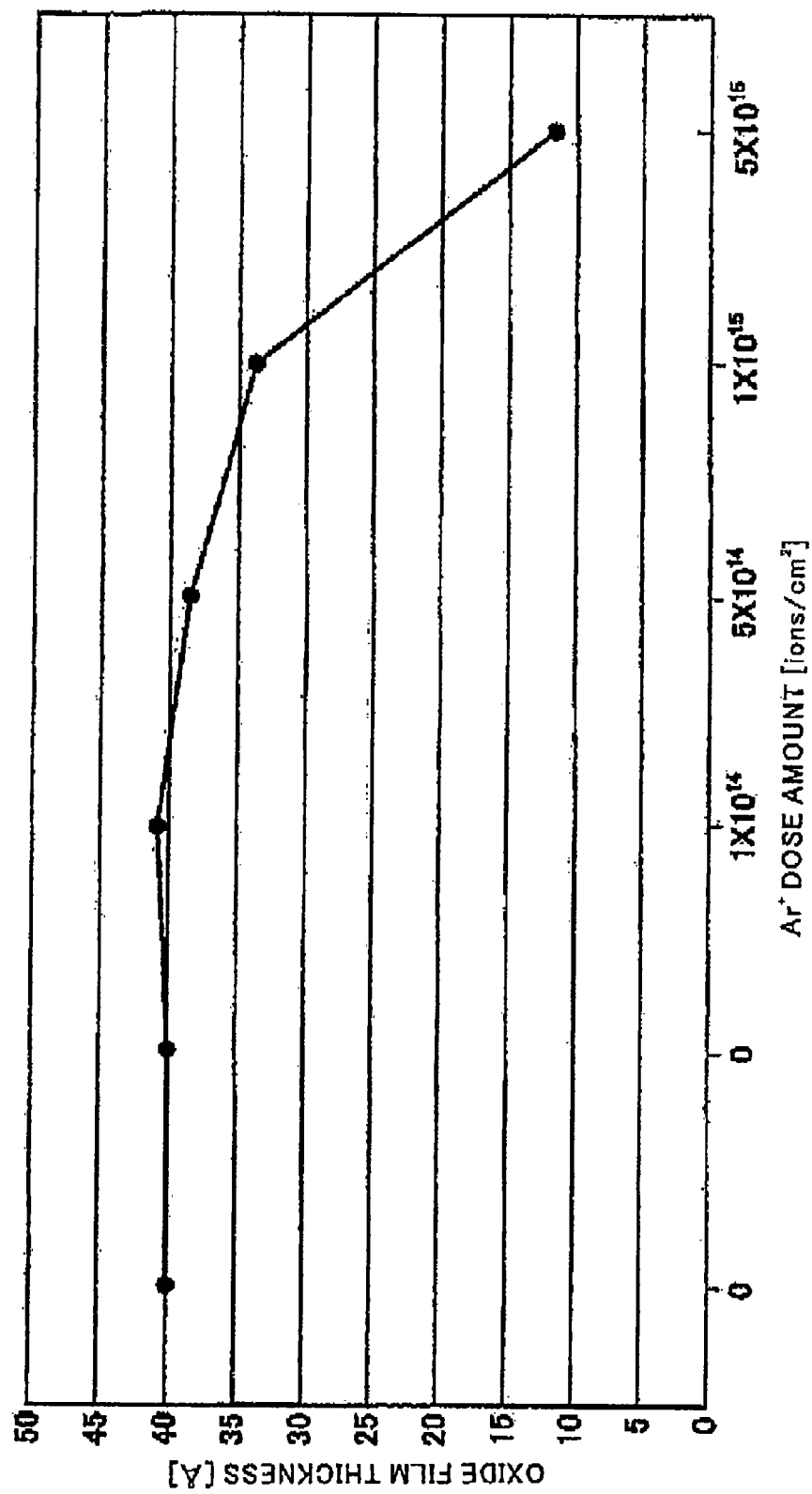
FIG. 4 is a graph showing a relationship between dose amounts of argon ions $Ar^+$ and silicon oxide film thicknesses.

In TABLE 1, "OXIDATION FILM THICKNESS" represents an average value of the silicon oxidation film thicknesses measured at 9 measure points scattered over the surface of each wafer. FIG. 4 is a graph showing a relationship between dose amounts of argon ions $Ar^+$ and silicon oxide film thicknesses. From the graph, it can be recognized that the oxidation film thickness gets smaller as the dose amount of argon ions $Ar^+$ gets larger than about $5 \times 10^{14}$ ions/$cm^2$.

According to the first embodiment of the present invention, the silicon oxide films 18a and 18b each having different thicknesses from the other can be easily obtained by performing the thermal oxidation process to the silicon nitride film 14 after selectively doping the argon ions $Ar^+$ to the silicon nitride film 14. Moreover, because a wet-etching process is unnecessary, the thicknesses of the silicon oxide films 18a and 18b can be precisely controlled by setting the oxidation condition properly.

FIG. 5 to FIG. 12 show a method for manufacturing capacitors according to a second embodiment of the present invention. In this manufacturing method, for example, two capacitors each having different capacitances will be formed.

Figure 5:
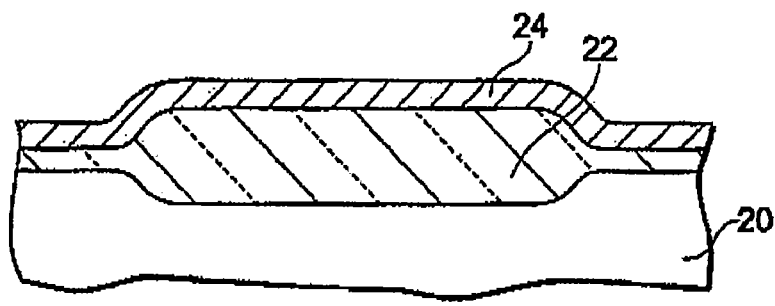
FIG. 5 is a cross sectional view showing a poly-silicon layer forming process in a method for manufacturing capacitors according to a second embodiment of the present invention.

In a process shown in FIG. 5, for example, isolation is performed to one main surface of a semiconductor substrate 20 made of a single crystal silicon. When local oxidation of silicon (LOCOS) isolation is performed, a field insulating film 22 made of silicon oxidation film is formed by performing a selective oxidation process. The field insulating film 22 can be formed by depositing an insulating film such as a silicon oxide film, etc. to cover grooves formed on the surface of the substrate 20 by the CVD method, etc. On the field insulating film 22, a poly-silicon layer 24 is formed by the CVD method. The poly-silicon layer 24 is doped with conductive type defining impurity such as phosphorus (P) to have proper low resistance to be able to be used as an electrode material. The poly-silicon layer 24 is used as conductive material layer to form a lower electrode layer. Any conductive layer which can be used as a capacitor lower electrode layer and processed in the later-executed thermal process such as a polycide layer, a single metal silicide layer and high melting point metal layer like tungsten, etc. can be arbitrary used in stead of the poly-silicon layer 24.

Figure 6:
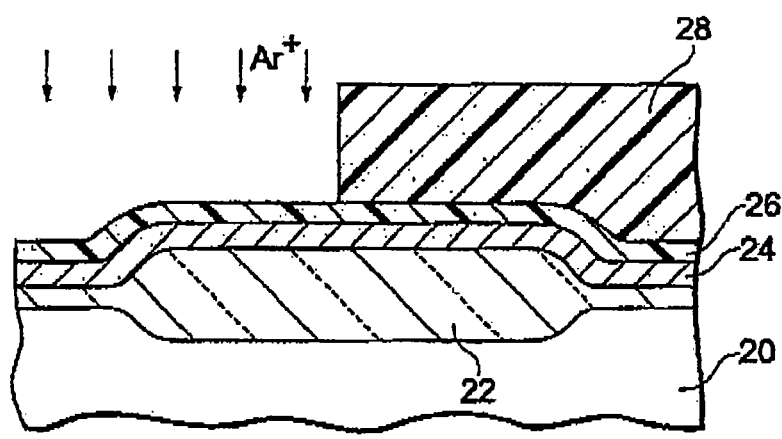
FIG. 6 is a cross sectional view showing a silicon oxynitride film forming process and an ion doping process following the process shown in FIG. 5.

In the process shown in FIG. 6, a silicon nitride film 26 is formed on the poly-silicon layer 24. The silicon nitride film 26 can be formed by the similar process explained with reference to FIG. 1. A resist layer 28 is formed on the silicon nitride film 24 in accordance with a predetermined pattern by a photolithography process to cover a part of the silicon nitride film 24 where oxidation speed should not be reduced and to expose a part of the silicon nitride film 24 where the oxidation speed should be reduced. Thereafter, argon ions Ar+ are selectively doped to the silicon nitride film 26 by the ion doping process using the resist layer 28 as a mask. The ion doping condition in this process can be the same as in the process shown in FIG. 2.

Figure 7:
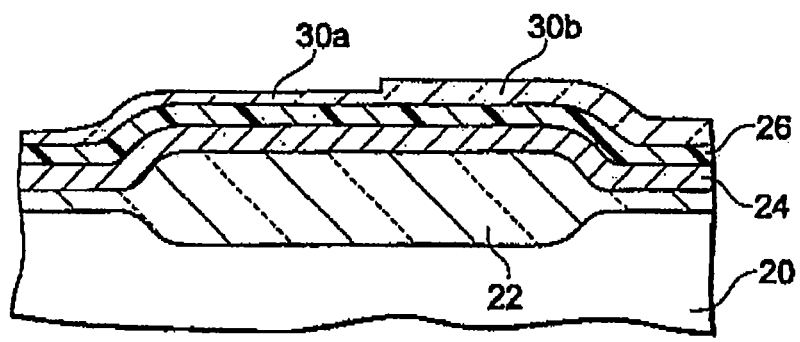
FIG. 7 is a cross sectional view showing a thermal oxidation process following the process shown in FIG. 6.

In the process shown in FIG. 7, the resist layer 28 is removed by an ashing process, etc. Thereafter, a thin silicon oxide film 30a and a thick oxide silicon film 30b are simultaneously formed by performing the thermal oxidation process to the silicon nitride film 26. The thermal oxidation condition in this process can be the same as in the process shown in FIG. 3.

Figure 8:
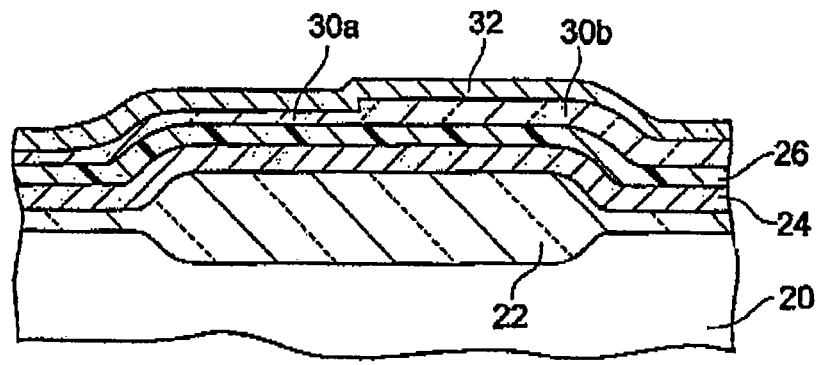
FIG. 8 is a cross sectional view showing a poly-silicon layer forming process following the process shown in FIG. 7.

In the process shown in FIG. 8, a poly-silicon layer 32 is formed to cover the silicon oxide films 30a and 30b by the CVD method. The poly-silicon layer 32 is made to have low resistance similar to the above-described poly-silicon layer 24.

In the process shown in FIG. 9, a tungsten silicide (hereinafter called the WSi) layer 34 is formed to overlap the poly-silicon layer 32. The WSi layer 34 is formed to reduce electrode resistance and can be formed by the sputtering or may be formed by coating the poly-silicon layer 32 with the tungsten layer by the sputtering and silicidizing the tungsten layer with the poly-silicon layer 32. A titan silicide layer, molybdenum silicide, etc. may be used instead of the WSi layer 34, or a high melting point metal such as W, Ti, Mo, etc. may be used. A lamination of the poly-silicon layer 32 and the WSi layer 34 is used as a conductive layer for forming an upper electrode.

Next, a resist layers 36a and 36b are formed on the WSi layer 34 respectively in accordance with a first and second capacitor patterns by the photolithography. The resist layer 36a is formed above the thin silicon oxide film 30a, and the resist layer 36b is formed above the thick silicon oxide film 30b.

Figure 10:
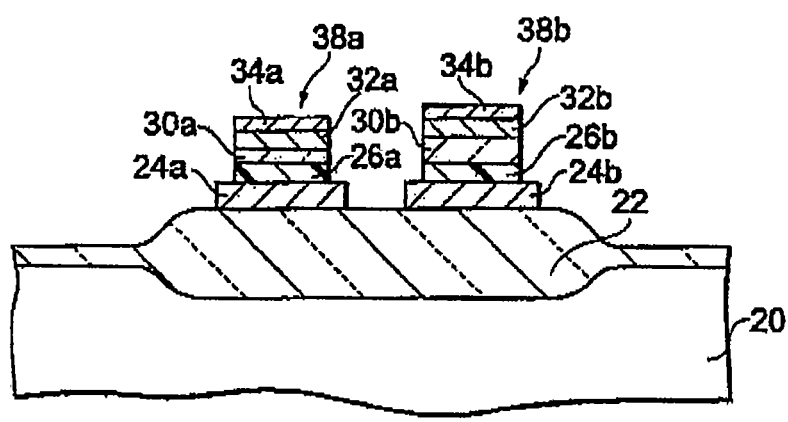
FIG. 10 is a cross sectional view showing a patterning process and a resist removing process following the process shown in FIG. 9.

In the process shown in FIG. 10, by the dry-etching process using the resist layers 36a and 36b, a first lamination layer composed of the silicon nitride layer 26, the silicon oxide film 30a, the poly-silicon layer 32 and the WSi layer 34 and a second lamination layer composed of the silicon nitride layer 26, the silicon oxide film 30b, the poly-silicon layer 32 and the WSi layer 34 are patterned to form a capacitance insulating film of a first capacitor with a remaining part 26a of the silicon nitride film 26 and a remaining part of the silicon oxide film 30a, and an upper electrode of the first capacitor with a remaining part 32a of the poly-silicon layer 32 and a remaining part 34a of the WSi layer 34, and simultaneously to form a capacitance insulating film of a second capacitor with a remaining part 26b of the silicon nitride film 26 and a remaining part of the silicon oxide film 30b, and an upper electrode of the second capacitor with a remaining part 32b of the poly-silicon layer 32 and a remaining part 34b of the WSi layer 34. Thereafter, the resist layers 36a and 36b are removed by the ashing process, etc.

Next, a first resist layer (not shown in the drawing) is formed on the poly-silicon layer 24 to cover the upper electrode layer and the capacitance insulating film of the first capacitor in accordance with a lower electrode (or wiring) pattern of the first capacitor, and simultaneously a second resist layer (not shown in the drawing) is formed on the poly-silicon layer 24 to cover the upper electrode layer and the capacitance insulating film of the second capacitor in accordance with a lower electrode (or wiring) pattern of the second capacitor. The first and the second resist layers can be formed at once by one photolithography process. The poly-silicon layer 24 is patterned by the dry-etching process using the first and the second resist layers as masks to form a lower electrode of the first capacitor with a remaining part 24a of the poly-silicon layer 24 and to form a lower electrode of the second capacitor with a remaining part 24b of the poly-silicon layer 24.

As a result of the above-described processes, it can be obtained the first capacitor 38a having the lower electrode formed of the poly-silicon layer 24a, the capacitance insulating film formed of the lamination of the silicon nitride film 26a and the silicon oxide film 30a and the upper electrode formed of a lamination of the poly-silicon layer 32a and the WSi layer 34a, and simultaneously it can be obtained the second capacitor 38b having the lower electrode formed of the poly-silicon layer 24b, the capacitance insulating film formed of the lamination of the silicon nitride film 26b and the silicon oxide film 30b and the upper electrode formed of a lamination of the poly-silicon layer 32b and the WSi layer 34b. If opposing areas of the upper and the lower electrode layers of the first and the second capacitors 38a and 38b are the same, capacitance of the first capacitor 38a will be larger than that of the second capacitor 38b because the silicon oxide film 30a is thinner than the silicon oxide film 30b.

Figure 11:
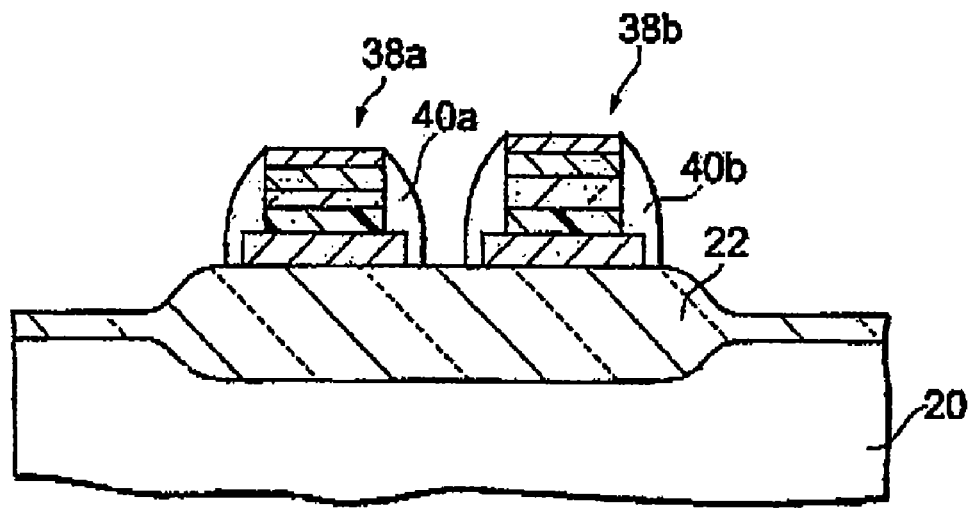
FIG. 11 is a cross sectional view showing a side spacer forming process following the process shown in FIG. 10.

In the process shown in FIG. 11, an insulating film (not shown in the drawing), for example, made of a silicon oxide film or a silicon nitride film is formed on the field insulating film 22 to cover the capacitors 38a and 38b by the CVD process with tetra ethyl ortho silicate (TEOS) as source material. A first side spacer 40a covering a sidewall of the first capacitor 38a and made of a first remaining part of the insulating film is formed by etching back the insulating film by an anisotropic dry-etching. At the mean time, a second side spacer 40b covering a sidewall of the second capacitor 38b and made of a second remaining part of the insulating film is formed by etching back the insulating film by an anisotropic dry-etching. The side spacers 40a and 40b are useful for capacitance protection films.

Figure 12:
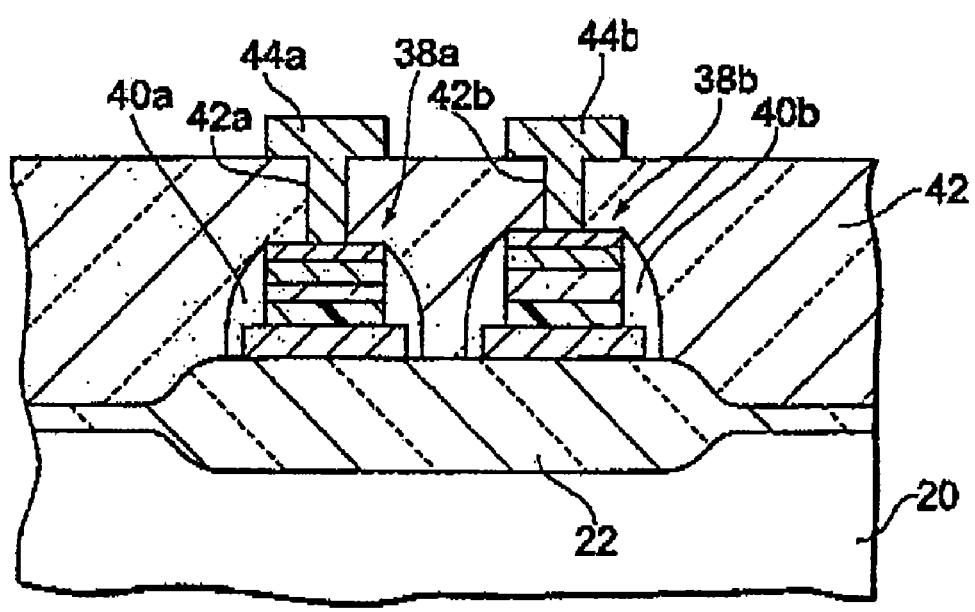
FIG. 12 is a cross sectional view showing an inter-layer insulating film forming process and a wiring layer forming process following the process shown in FIG. 11.

In the process shown in FIG. 12, an interlayer insulating film 42 is formed above the substrate (on the field insulating film 22) to cover the capacitors 38 and 38b and the side spacers 40a and 40b by the CVD method, etc. Thereafter, in the insulating film 42, a first connecting hole 42a corresponding to the upper electrode layer of the capacitor 38a and a second connecting hole 42b corresponding to the upper electrode layer of the capacitor 38b by the photolithography and the dry-etching processes.

After that, wiring layers 44a and 44b are formed on the interlayer insulating film 42 by coating the connecting holes 42a and 42b with a wiring material layer made of Aluminum alloy, etc. by sputtering or the like and selectively patterning the wiring material layer by the dry-etching. The wiring layers 44a and 44b are respectively connected to the upper electrodes of the capacitors 38a and 38b via the connecting holes 42a and 42b.

Figure 13:
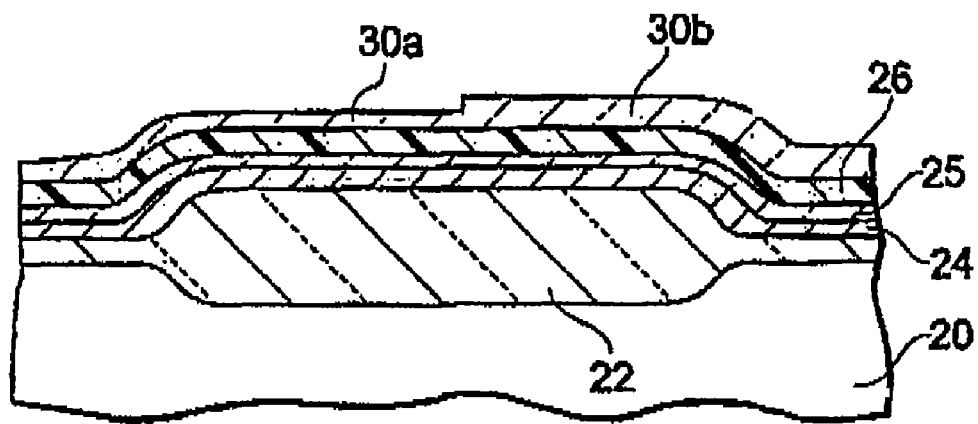
FIG. 13 is a cross sectional view showing a thermal oxidation process in a modified example of a method for manufacturing capacitors according to the second embodiment of the present invention.
Figure 14:
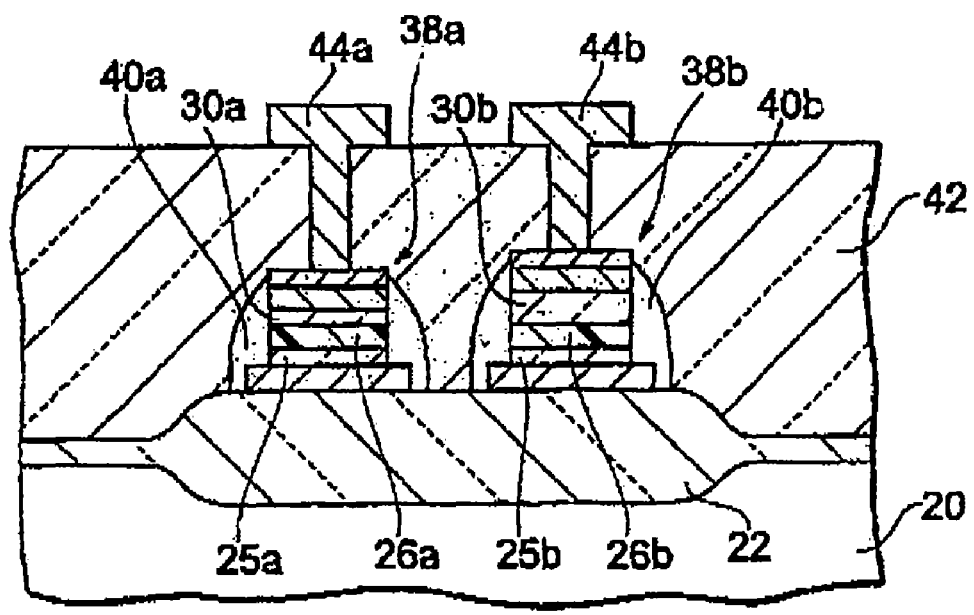
FIG. 14 is a cross sectional view showing a wiring layer forming process in the modified example shown in FIG. 13.
Figure 22:
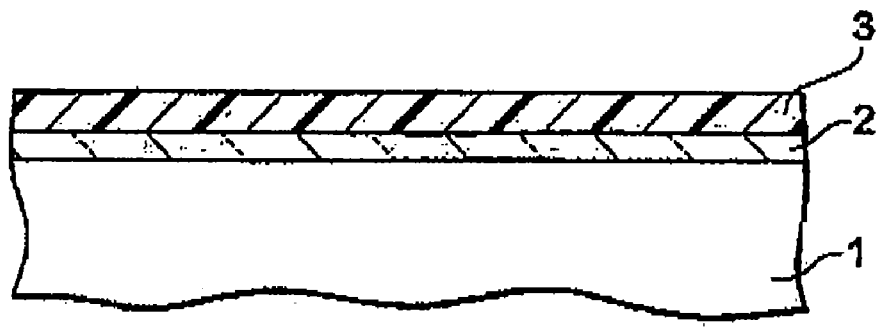
FIG. 22 is a cross sectional view showing a silicon nitride film forming process in a method for forming a silicon oxide film according to a research by the inventors.
Figure 23:
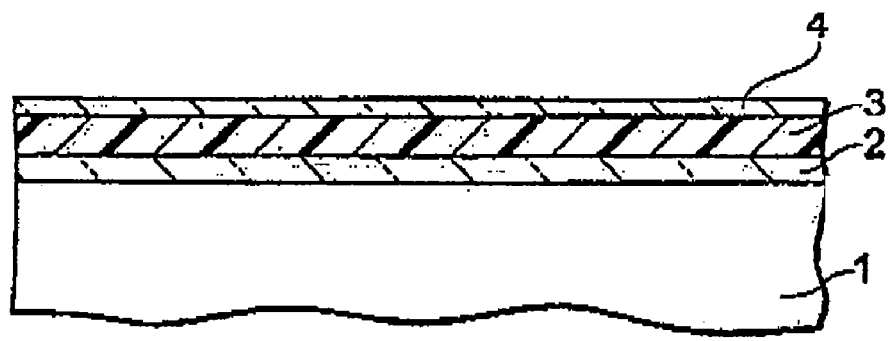
FIG. 23 is a cross sectional view showing a thermal oxidation process following the process shown in FIG. 22.
Figure 24:
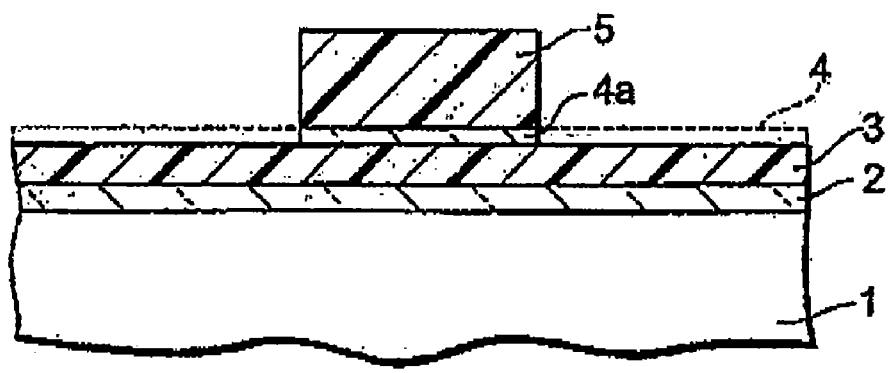
FIG. 24 is a cross sectional view showing a wet etching process following the process shown in FIG. 23.
Figure 25:
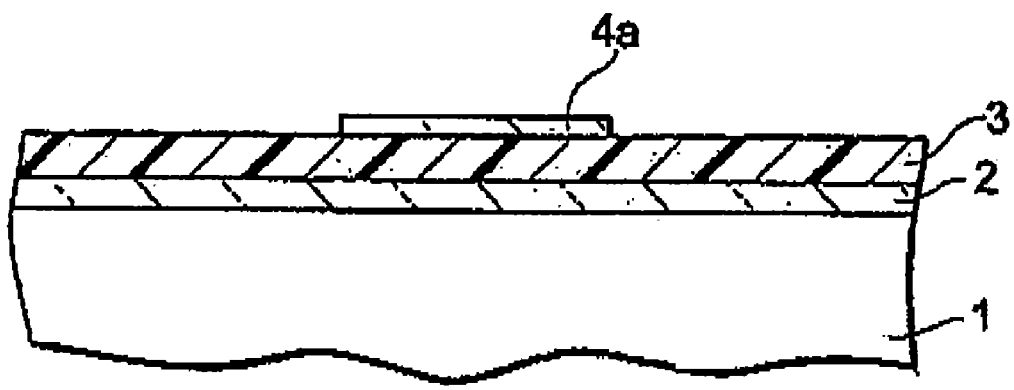
FIG. 25 is a cross sectional view showing a resist removing process following the process shown in FIG. 24.
Figure 26:
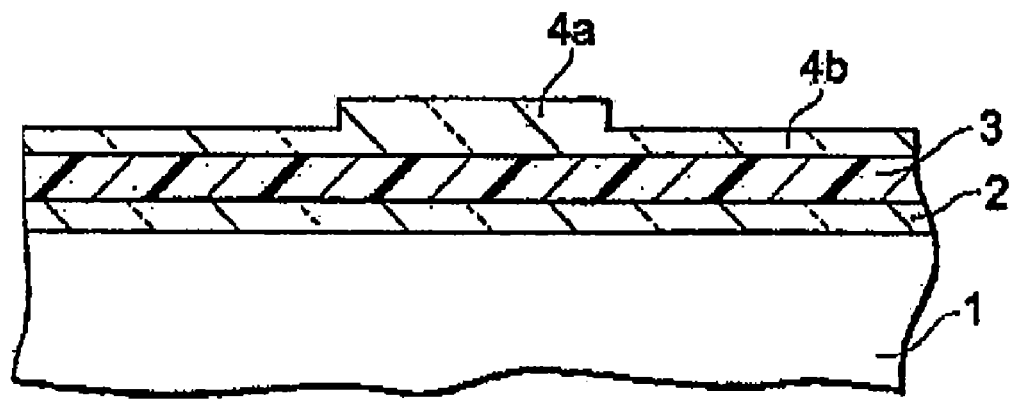
FIG. 26 is a cross sectional view showing a thermal oxidation process following the process shown in FIG. 25.

According to the second embodiment of the present invention described with reference to FIG. 5 to FIG. 12, the capacitance insulating films of the capacitors 38a and 38b are formed, each having the different thickness from the other by applying the method for forming silicon oxide films according to the first embodiment described with reference to FIG. 1 to FIG. 4; therefore, the capacitors 38a and 38b, each having different capacitance, can be easily and precisely manufactured FIG. 13 and FIG. 14 show a modified example of the method for manufacturing capacitors according to the second embodiment of the present invention. The components similar to the second embodiment are marked with the same reference numbers and their explanations will be omitted. The characteristic of this modified example is that a silicon oxide film 25 is formed on the poly-silicon layer 24 in the process shown in FIG. 5. The silicon oxide film 25 can be formed by the thermal oxidation process or by the CVD method, etc.

FIG. 13 shows a condition that the silicon nitride film 26 is formed by the similar way as in the processes described with reference to FIG. 6 and FIG. 7 after forming the silicon oxide film 25 and the argon ions Ar+ are selectively doped to the silicon nitride film 26, and thereafter the thin silicon oxide film 30a and the thick silicon oxide film 30b are formed by performing the thermal oxidation process to the silicon nitride film 26.

Figure 9:
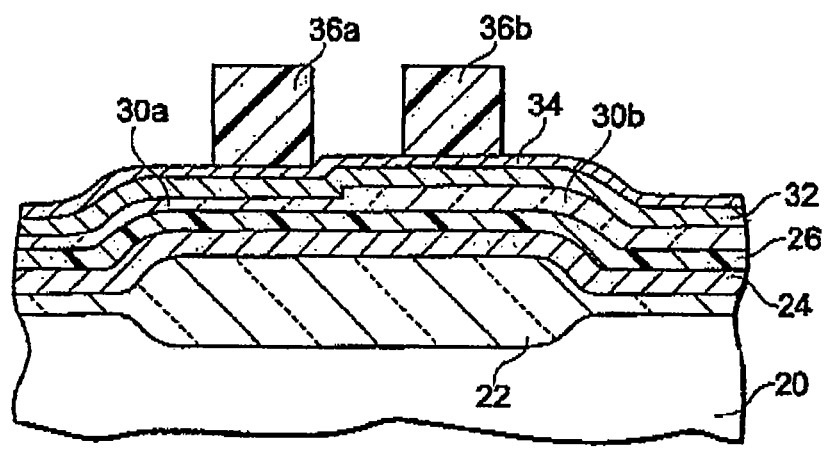
FIG. 9 is a cross sectional view showing a Wsi layer process and a resist layer forming process following the process shown in FIG. 8.

As shown in FIG. 13, after forming the silicon oxide films 30a and 30b, the poly-silicon layer 32 and the WSi layer 34 are sequentially formed to cover the silicon oxide films 30a and 30b by the similar processes shown in FIG. 8 and FIG. 9. Then, as shown in FIG. 14, remaining parts 25a and 25b of the silicon oxide film 25 are respectively added under the silicon nitride films 26a and 26b by patterning the silicon oxide film 25 together with the silicon oxide films 30a and 30b at the time of forming the capacitance insulating films of the capacitors 38a and 38b by the dry-etching processes using the resist layers 36a and 36b as masks as shown in FIG. 9 and FIG. 10. Thereafter, the poly-silicon layer 24 is patterned as in the process shown in FIG. 10, and the forming processes for the side spacers 40a and 40b, the interlayer insulating film 42 and the wiring layers 44a and 44b as shown in FIG. 11 and FIG. 12.

According to the modified example of the second embodiment of the present invention described with reference to FIG. 13 and FIG. 14, a structure of the capacitance insulating film of the capacitor 38a becomes symmetrical wherein the silicon nitride film 26a is enclosed by the silicon oxide films 30a and 25a from a top and a bottom, and a structure of the capacitance insulating film of the capacitor 38b becomes symmetrical wherein the silicon nitride film 26b is enclosed by the silicon oxide films 30b and 25b from a top and a bottom. Therefore, if the polarity is upside down, voltage characteristics of capacitance will be symmetrical in both capacitors 38a and 38b, and stability of the capacitance characteristics will be improved and degree of freedom in the architecture will be improved.

FIG. 15A to FIG. 20L show a method for manufacturing a metal-oxide semiconductor (MOS) type integrated circuit (IC) according to a third embodiment of the present invention. For example, two of N-channel MOS type transistors of which gate insulating films have different thicknesses with each other will be manufactured.

In the process shown in FIG. 15A, for example, p-type defining impurity is selectively ion-doped to one main surface of a semiconductor substrate 50 made of p-type single crystal silicon in accordance with forming patterns of well regions 52 and 54. Then, on the one main surface of the substrate 50, a field insulating film 56 made of silicon oxide film having element holes 56a and 56b corresponding to the two ion-doped regions is formed by a selective oxidation process. P-type well regions 52 and 54 are formed in positions respectively corresponding to the element holes 56a and 56b by that the p-type defining impurity doped at the before-performed ion-doping process is activated and diffused by a thermal process of this thermal oxidation process. The field insulating film 56 may be formed by depositing an insulating film such as a silicon oxide film, etc. to cover grooves formed on the surface of the substrate 50 by the CVD method or the like.

Next, insulating thin films 58 and 60 made of silicon oxide films are formed on semiconductor surfaces of the element holes 56a and 56b by the thermal oxidation process. The insulating thin films 58 and 60 are used as stress relaxation films and can be formed by the similar process of forming the silicon oxide film 12 shown in FIG. 1. A silicon nitride film 62 covering the insulating thin films 58 and 60 is formed on the field insulating film 56. The silicon nitride film 62 can be formed by the similar process of forming the silicon nitride film 14 shown in FIG. 1.

In the process shown in FIG. 15B, a resist layer 64 is formed on the silicon nitride film 62 with exposing the element hole 56a and covering the element hole 56b by the photolithography. Then, conductive type defining ions for threshold value voltage control are doped to a surface of the well region 52 via the silicon nitride film 62 and the insulating film 58 with using a lamination of the field insulating film 56 and the silicon nitride film 62 and the resist layer 64 as a mask.

In the process shown in FIG. 16C, the argon ions Ar+ are doped to an exposed part of the silicon nitride film 62 by the ion-doping process sing the resist layer 64 as a mask. The ion-loping condition in this process can be the same as that in the process shown in FIG. 2.

In the process shown in FIG. 16D, the resist layer 64 is removed by the ashing process or the like. Then, by performing the thermal oxidation process to the silicon nitride film 62, a thin silicon oxide film 66a is formed in the part of the silicon nitride film 62 to which the argon ions Ar+ are doped, and a thick silicon oxide film 66b is formed in the part of the silicon nitride film 62 to which the argon ions Ar+ are not doped. The thermal oxidation condition in this process can be the same as in the process shown in FIG. 3.

In the process shown in FIG. 17E, a poly-silicon layer 68 is formed covering the silicon oxide films 66a and 66b. The poly-silicon layer 68 is made to have low resistance as same as the poly-silicon layer 24 described with reference to FIG. 5. In the process shown in FIG. 17F, a WSi layer 70 is formed on the poly-silicon layer 68. The WSi layer 70 can be formed by the same process as in the process of forming the WSi layer 34 described with reference to FIG. 9, and the above-described high melting point metal layer or its silicide layer explained with reference to FIG. 9 may be used instead of the WSi layer 70. A lamination of the poly-silicon layer 68 and the WSi layer 70 is used for a conductive material layer for forming gate electrode layer.

Next, resist layers 72a and 72b are formed on the WSi layer 70 by the photolithography process respectively in accordance with a first and a second gate electrode patterns. The resist layer 72a is formed to be placed above the thin silicon oxide film 66a in the element hole 56a, and the resist layer 72b is formed to be placed above the thick silicon oxide film 66b in the element hole 56b. Thereafter, by patterning the lamination of the poly-silicon layer 68 and the WSi layer 70 by the dry-etching process using the resist layers 72a and 72b, a first gate electrode layer $G_1$ composed of a remaining part 68a of the poly-silicon layer 68 and a remaining part 70a of the WSi layer 70 and a second gate electrode layer $G_2$ composed of a remaining part 68b of the poly-silicon layer 68 and a remaining part 70b of the WSi layer 70 are formed as shown in FIG. 18G. Then, the resist layers 72a and 72b are removed.

In the process shown in FIG. 18G, a resist layer 74 is formed on the silicon oxide films 66a and 66b with exposing the element hole 56a and covering the element hole 56b by the photolithography process. Then, n-type defining impurity ions are ion-doped to the well region 52 via the silicon oxide film 66a, the silicon nitride film 62 and the insulating thin film 58 by the ion-doping process using the gate electrode layer $G_1$ and the resist layer 74 as a mask to form an $n^-$-type source region 76 and an $n^-$-type drain (lower doped drain: LDD) region 78 respectively on one side and another sides of the gate electrode layer $G_1$. This ion-doping process uses phosphorus as the n-type defining impurity and is performed as a rotation doping at acceleration voltage of 140 keV, a dose amount of $2\times10^{13}$ ions/cm$^2$, an inclined angle of 45 degrees. Thereafter, the resist layer 74 is removed.

In the process shown in FIG. 18H, a resist layer 80 is formed on the silicon oxide films 66a and 66b with exposing the element hole 56b and covering the element hole 56a by the photolithography process. Then, n-type defining impurity ions are ion-doped to the well region 54 via the silicon oxide film 66b, the silicon nitride film 62 and the insulating thin film 60 by the ion-doping process using the gate electrode layer $G_2$ and the resist layer 80 as a mask to form an $n^-$-type source region 82 and an $n^-$-type drain (lower doped drain: LDD) region 84 respectively on one side and another sides of the gate electrode layer $G_2$. This ion-doping process uses phosphorus as the n-type defining impurity and is performed as a rotation doping at acceleration voltage of 170 keV, a dose amount of $2\times10^{13}$ ions/cm$^2$, an inclined angle of 45 degrees. Thereafter, the resist layer 80 is removed.

In the process shown in FIG. 19I, an insulating film 86, for example, made of a silicon oxide film is formed on the silicon oxide films 66a and 66b to cover gate electrode layers $G_1$ and $G_2$ by the CVD process with tetra ethyl ortho silicate (TEOS) as source material. Then in the process shown in FIG. 19J, a first and a second side spacers 86a and 86b covering one and another sidewall of the gate electrode layers $G_1$ and respectively made of a first and a second remaining parts of the insulating film 86 are formed by etching back the insulating film 86 by the anisotropic dry-etching. At the mean time, a third and a fourth side spacers 86c and 86d covering one and another sidewall of the gate electrode layers $G_2$ and respectively made of a third and a fourth remaining parts of the insulating film 86 are formed by etching back the insulating film 86 by the anisotropic dry-etching. Further at this time, the silicon oxide film 66a is removed by the dry-etching process to be selectively remained under the gate electrode layer $G_1$ and the side spacers 86a and 86b, and the silicon oxide film 66b is removed by the dry-etching process to be selectively remained under the gate electrode layer $G_2$ and the side spacers 86c and 86d. In this case, the silicon nitride 62 is remained.

In the process shown in FIG. 20K, a resist layer 90 having holes 80a and 90b respectively exposing the element holes 56a and 56b are formed on the silicon nitride film 62 by the photolithography process. Then, n-type defining impurity ions are ion-doped to the well region 52 via the silicon nitride film 62 and the insulating thin film 58 by the ion-doping process using the gate electrode layer $G_1$ and the resist layer 90 as a mask to form an $n^+$-type source region 92 and an $n^+$-type drain region 94 respectively on one side and another sides of the gate electrode layer $G_1$. Simultaneously, n-type defining impurity ions are ion-doped to the well region 54 via the silicon nitride film 62 and the insulating thin film 60 by the ion-doping process using the gate electrode layer $G_2$ and the resist layer 90 as a mask to form an $n^+$-type source region 96 and an $n^+$-type drain region 98 respectively on one side and another sides of the gate electrode layer $G_2$. This ion-doping process uses phosphorus as the n-type defining impurity and is performed as a rotation doping at acceleration voltage of 120 keV, a dose amount of $2\times10^{15}$ ions/cm$^2$, an inclined angle of 7 degrees. Thereafter, the resist layer 90 is removed. After that, the ion-doped impurity will be activated by an annealing process at a temperature of 950 degrees Celsius for about 10 seconds. This annealing process can be performed after every ion-doping process or after some ion-doping processes.

As a result of the above-described processes according to the third embodiment of the present invention, the n-channel MOS type transistors 100a and 100b each having the different thickness from the other are formed respectively in the well regions 52 and 54. The transistor 100a has the source regions 76 and 92, the drain regions 78 and 94, the gate insulating film composed of the insulating thin film 58, the silicon nitride film 62 and the thin silicon oxide film 66a, the gate electrode film $G_1$ and the side spacers 86a and 86b. The transistor 100b has the source regions 82 and 96, the drain regions 84 and 98, the gate insulating film composed of the insulating thin film 60, the silicon nitride film 62 and the thick silicon oxide film 66b the gate electrode film $G_2$ and the side spacers 86c and 86d. The transistor 100b has higher gate capability than the transistor 100a because the thickness of the gate insulating film of the transistor 100b is thicker than that of the transistor 100a by making the silicon oxide film 66b thicker than the silicon oxide film 66a.

In the process shown in FIG. 20L, an interlayer insulating film 102 is formed on the silicon nitride film 62 with covering the transistors 100a and 100b by the CVD method, etc. Then, connecting holes 102a and 102b respectively corresponding to the $n^+$-type source and drain regions 92 and 94 are formed in a lamination of the insulating film 102, the silicon nitride film 62 and the insulating thin film 58 by the photolithography and the dry-etching processes, and connecting holes 102c and 102d respectively corresponding to the $n^+$-type source and drain regions 96 and 98 are formed in a lamination of the insulating film 102, the silicon nitride film 62 and the insulating thin film 60 by the photolithography and the dry-etching processes.

After that, wiring layers 104, 106, 108 and 110 are formed on the interlayer insulating film 102 by coating the connecting holes 102a to 102d with a wiring material layer made of Aluminum alloy, etc. by sputtering or the like and selectively patterning the wiring material layer by the dry-etching. The wiring layers 104, 106, 108 and 110 are respectively connected to the source region 92, the drain region 94, the source region 96 and the drain region 98 via the connecting holes 102a, 102b, 102c and 102d.

According to the third embodiment of the present invention described with reference to FIG. 15A to FIG. 20L, the gate insulating films of the transistors 100a and 100b are formed to have different thicknesses with each other by the method for forming silicon oxide films according to the first embodiment of the present invention described with reference to FIG. 1 to FIG. 3; therefore, the MOS type transistors 100a and 100b, each having different gate capacity from that of the other can be easily and precisely manufactured. Moreover, the selectively removing of the silicon oxide films 66a and 66b can be performed continuously right after the etching back process for forming the side spacers 86a to 86d. Therefore, the processes are easy. Further, the silicon nitride film 62 is remained as a water preventing film; therefore, reverse of a conductive type and increase in leak current caused from water, and reliability of the transistors improves.

FIG. 21A and FIG. 21B show a modified example of the method for manufacturing a MOS type IC according to the third embodiment of the present invention. The components similar to the third embodiment are marked with the same reference numbers and their explanations will be omitted. The characteristic of this modified example is that the silicon nitride film 62 are selectively removed to maintain parts 62a and 62b of the silicon nitride film 62 under the gate electrode layers $G_1$ and $G_2$ as shown in FIG. 21A by the dry-etching process following the patterning of the silicon oxide films 66a and 66b in the process shown in FIG. 19J. In this case, in order to move from the etching of the silicon oxide films 66a and 66b to etching of the silicon nitride film 62, the etching gas is changed or an etching chamber is changed without exposing the substrate 50 in the atmosphere.

FIG. 21A shows a condition that the $n^+$-type source and drain regions 92 and 94 and the $n^+$-type source and drain regions 96 and 98 are formed by the same ion-doping process of n-type defining impurity described with reference to FIG. 20 after removing the silicon nitride film 62 with maintaining the silicon nitride films 62a and 62b in the process shown in FIG. 19J. This ion-doping process uses phosphorus as the n-type defining impurity and is performed at acceleration voltage of 40 keV, a dose amount of $5 \times 10^{15}$ ions/cm². Thereafter, the interlayer insulating film 102, the connecting holes 102a to 102d and the wiring layer 104 to 110 are formed as shown in FIG. 21B by the same processes described with reference to FIG. 20.

According to the modified example of the third embodiment of the present invention described with reference to FIG. 21A and FIG. 21B, the ion-doping can be performed via only the insulating thin films 58 and 60 in the process shown in FIG. 21A, therefore, the acceleration voltage can be low and so charge up damage can be reduced.

Although the MOS type transistors having the LDD structure are formed in the third embodiment of the present invention, other types of MOS transistors having a structure other than the LDD structure may be formed. For that, after performing the gate patterning in the process shown in FIG. 17F, the process should proceed to the process shown in FIG. 19J without performing the processes shown in FIG. 18G, FIG. 18H and FIG. 19I. In the process shown in FIG. 19J, the silicon oxide films 66a and 66b are selectively removed by the dry-etching process using the gate electrode layers $G_1$ and $G_2$. When the silicon nitride films 62a and 62b are maintained respectively under the gate electrode layers $G_1$ and $G_2$ only as shown in FIG. 21B, the silicon nitride film 62 is selectively removed by the dry-etching process continuously executed following the selectively removing the silicon oxide films 66a and 66b in the process shown in FIG. 19J. After the process shown in FIG. 19J, the process proceeds to the process shown in FIG. 20K or in FIG. 21A, and the $n^+$-type source and drain regions 92 and 94 and the $n^+$-type source and drain regions 96 and 98 are formed by the ion-doping process using the gate electrode layers $G_1$ and $G_2$ as a mask.

Although the plurality of the n-channel MOS type transistors each of which has the gate insulating film with a thickness different from that of the other transistor are formed in the above-described third embodiment of the present invention, a plurality of p-channel MOS type transistors each of which has a gate insulating film with a thickness different from that of the other transistor can be formed by setting the conductive type opposing from the above-described embodiment. Moreover, by differentiating the conductive types of the well regions 52 and 54 and properly selecting the doped impurity, an n-channel MOS type transistor can be formed in one of the well regions 52 and 54 and a p-channel MOS type transistor can be formed in another one of the well regions 52 and 54 with differentiating the thicknesses of the gate insulating films of the transistors.

The present invention has been described in connection with the preferred embodiments. The invention is not limited only to the above embodiments. It is apparent that various modifications, improvements, combinations, and the like can be made by those skilled in the art. For example, following modifications are possible.

Although a silicon oxide film is formed by performing the thermal oxidation process to a silicon nitride film in the above-described embodiments, a silicon oxynitride film can be used instead of the silicon nitride film.

Although the argon ions are used for changing oxidation speed in the above-described embodiments, inactive atoms such as helium, neon, krypton, xenon, radon, etc. or nitrogen ions can be used for that.

Although two types, thin and thick, of the silicon oxide films are simultaneously formed in the above-described embodiments, three types of silicon oxide films may be simultaneously formed by setting a dose amount of impurity ions at large, medium, small (can be "0") in advance. In this case, the number of ion-doping processes and masks can be increased based on necessity.

The embodiments of the present invention can be applied not only to the case for differentiating the insulating film thicknesses among a plurality of circuit elements but also the case that a plurality of insulating films with different thicknesses are necessary in one circuit element such as a memory cell of an electrically erasable and programmable read only memory (EEFPROM). Moreover, the embodiments of the present invention can be applied to an integrated circuit where circuits such as a memory cell and a driver circuit are driven by different voltages, and to a tunnel insulating film used in a memory cell.

The electrode layer of a capacitor can be made of a selection from a poly-silicon layer, polycide layer, a single layer of a metal silicide and a high melting point metal such as tungsten, and the upper and the lower electrode layers can be made either of the same material or different materials. Moreover, the electrode layer of a capacitor can be made of alloy of IV-group metals such as poly-silicon and germanium, polycrystalline, a good conductive nitride compound such as Ti alloy and TiN, etc. The upper electrode layer can be made of transition metal (Ni, Co, Cr), Al or Cu because it is not processed by the thermal process.

What are claimed are:

1. A method for forming silicon oxide films, comprising the steps of:
   (a) preparing a substrate;
   (b) forming a silicon nitride film or a silicon oxynitride film covering one main surface of the substrate;
   (c) forming an ion-doping mask on the silicon nitride film or the silicon oxynitride film in accordance with a predetermined pattern;
   (d) doping an impurity ion for changing oxidation speed to the silicon nitride film or the silicon oxynitride film by a selective ion doping process using the ion doping mask;
   (e) removing the ion-doping mask; and
   (f) performing a thermal oxidation process to the silicon nitride film or the silicon oxynitride film so as to form a first silicon oxide film in a part of the silicon nitride film or the silicon oxynitride film where the impurity ion is doped and to form a second silicon oxide film in a part of the silicon nitride film or the silicon oxynitride film where the impurity ion is not doped with a thickness different from a thickness of the first silicon oxide film.

2. The method for forming silicon oxide films according to claim 1, wherein the selective ion doping process at the step (d) uses an inert atom or a nitride ion as the impurity ion for changing oxidation speed, and
   the first silicon oxide film is formed to be thinner than the second silicon oxide film at the step (f).

3. A method for manufacturing capacitors, comprising the steps of:
   (a) preparing a substrate having an insulating surface;
   (b) forming a first conductive material layer on the insulating surface of the substrate;
   (c) forming a silicon nitride film or a silicon oxynitride film on the conductive material layer;
   (d) forming an ion-doping mask on the silicon nitride film or the silicon oxynitride film in accordance with a predetermined pattern;
   (e) doping an impurity ion for changing oxidation speed to the silicon nitride film or the silicon oxynitride film by a selective ion doping process using the ion doping mask;
   (f) removing the ion-doping mask;
   (g) performing a thermal oxidation process to the silicon nitride film or the silicon oxynitride film so as to form a first silicon oxide film in a part of the silicon nitride film or the silicon oxynitride film where the impurity ion is doped and to form a second silicon oxide film in a part of the silicon nitride film or the silicon oxynitride film where the impurity ion is not doped with a thickness different from a thickness of the first silicon oxide film;
   (h) forming a second conductive material layer covering the first and the second silicon oxide films;
   (i) patterning a first lamination including the silicon nitride film or the silicon oxynitride film, the first silicon oxide film and the second conductive material layer in accordance with a pattern of a first capacitor pattern to form a capacitance insulating film of a first capacitor with a first remaining part of the silicon nitride film or the silicon oxynitride film and a remaining part of the first silicon oxide film and to form an upper electrode layer of the first capacitor with a first remaining part of the second conductive material layer, and patterning a second lamination including the silicon nitride film or the silicon oxynitride film, the second silicon oxide film and the second conductive material layer in accordance with a pattern of a second capacitor pattern to form a capacitance insulating film of a second capacitor with a second remaining part of the silicon nitride film or the silicon oxynitride film and a remaining part of the second silicon oxide film and to form an upper electrode layer of the second capacitor with a second remaining part of the second conductive material layer; and
   (j) patterning the first conductive material layer below the upper electrode layer of the first capacitor to form a lower electrode layer of the first capacitor with a first remaining part of the first conductive material layer, and patterning the first conductive material layer below the upper electrode layer of the second capacitor to form a lower electrode layer of the second capacitor with a second remaining part of the first conductive material layer.

4. The method for manufacturing capacitors according to claim 3, further comprising the step of (k) forming a third silicon oxide film on the first conductive material layer between the steps (b) and (c), and wherein
   the step (i) patterns the third silicon oxide film together with the first lamination layer in accordance with the first capacitor pattern to add a first remaining part of the third silicon oxide film under the first remaining part of the silicon nitride film or the silicon oxynitride film in the capacitance insulating film of the first capacitor, and patterns the third silicon oxide film together with the second lamination layer in accordance with the second capacitor pattern to add a second remaining part of the third silicon oxide film under the second remaining part of the silicon nitride film or the silicon oxynitride film in the capacitance insulating film of the second capacitor.

5. A method for manufacturing a semiconductor device, comprising the steps of:
   (a) preparing a semiconductor substrate, on one main surface of which a field insulating film having a first and a second element holes, wherein a semiconductor parts inside the first and the second element holes have same conductive type or different conductive types from each other;
   (b) forming a first and a second insulating thin films covering the semiconductor parts of the first and the second element holes respectively;
   (c) forming a silicon nitride film or a silicon oxynitride film covering the first and the second insulating thin films on the field insulating film;
   (d) forming an ion-doping mask not covering a part of the silicon nitride film or the silicon oxynitride film corresponding to the first element hole but covering a part of the silicon nitride film or the silicon oxynitride film corresponding to the second element hole;
   (e) doping an impurity ion for changing oxidation speed to the part of the silicon nitride film or the silicon oxynitride film corresponding to the first element hole by a selective ion doping process using the ion doping mask;
   (f) removing the ion-doping mask;
   (g) performing a thermal oxidation process to the silicon nitride film or the silicon oxynitride film so as to form a first silicon oxide film in the part of the silicon nitride film or the silicon oxynitride film corresponding to the first element hole and to form a second silicon oxide film in the part of the silicon nitride film or the silicon oxynitride film corresponding to the second element hole with a thickness different from a thickness of the first silicon oxide film;
   (h) forming a conductive material layer covering the first and the second silicon oxide films;
   (i) patterning the conductive material layer inside the first element hole in accordance with a first gate electrode pattern to form a first gate electrode layer composed of a first remaining part of the conductive material layer, and patterning the conductive material layer inside the second element hole in accordance with a second gate electrode pattern to form a second gate electrode layer composed of a second remaining part of the conductive material layer;

(j) selectively removing the first and the second silicon oxide films by a dry-etching process using the first and the second gate electrode layers as masks so as to remain a part of the first silicon oxide film under the first gate electrode layer and to remain a part of the second silicon oxide film under the second gate electrode layer; and (k) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first source region on one side of the first gate electrode layer and to form a first drain region on another side of the first gate electrode layer, and doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second source region on one side of the second gate electrode layer and to form a second drain region on another side of the second gate electrode layer.

6. The method for manufacturing a semiconductor device according to claim 5, further comprising the steps of:

(l) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first low-concentration source region and a first low-concentration drain region respectively on one side and another side of the first gate electrode layer between the steps (j) and (k), the first low-concentration source region having lower impurity concentration than the first source region and the first low-concentration drain region having lower impurity concentration than the first drain region;

(m) doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second low-concentration source region and a second low-concentration drain region respectively on one side and another side of the second gate electrode layer between the steps (j) and (k), the second low-concentration source region having lower impurity concentration than the second source region and the second low-concentration drain region having lower impurity concentration than the second drain region;

(n) forming an insulating film covering the first and the second gate electrode films on the first and the second silicon oxide films; and (o) etching back the insulating film to form a first and a second side spacers respectively composed of a first and a second remaining parts of the insulating film on the one side and another side of the first gate electrode layer and to form a third and a fourth side spacers respectively composed of a third and a fourth remaining parts of the insulating film on the one side and another side of the second gate electrode layer, and wherein the dry-etching in the step (j) is executed after the step (o), and the step (k) further uses the first and the second side spacers as masks for the ion doping to form the first source region and the first drain region and further uses the third and the fourth side spacers as masks for the ion doping to form the second source region and the second drain region.

7. A method for manufacturing a semiconductor device, comprising the steps of:

(a) preparing a semiconductor substrate, on one main surface of which a field insulating film having a first and a second element holes, wherein a semiconductor parts inside the first and the second element holes have same conductive type or different conductive types from each other;

(b) forming a first and a second insulating thin films covering the semiconductor parts of the first and the second element holes respectively;

(c) forming a silicon nitride film or a silicon oxynitride film covering the first and the second insulating thin films on the field insulating film;

(d) forming an ion-doping mask not covering a part of the silicon nitride film or the silicon oxynitride film corresponding to the first element hole but covering a part of the silicon nitride film or the silicon oxynitride film corresponding to the second element hole;

(e) doping an impurity ion for changing oxidation speed to the part of the silicon nitride film or the silicon oxynitride film corresponding to the first element hole by a selective ion doping process using the ion doping mask;

(f) removing the ion-doping mask;

(g) performing a thermal oxidation process to the silicon nitride film or the silicon oxynitride film so as to form a first silicon oxide film in the part of the silicon nitride film or the silicon oxynitride film corresponding to the first element hole and to form a second silicon oxide film in the part of the silicon nitride film or the silicon oxynitride film corresponding to the second element hole with a thickness different from a thickness of the first silicon oxide film;

(h) forming a conductive material layer covering the first and the second silicon oxide films;

(i) patterning the conductive material layer inside the first element hole in accordance with a first gate electrode pattern to form a first gate electrode layer composed of a first remaining part of the conductive material layer, and patterning the conductive material layer inside the second element hole in accordance with a second gate electrode pattern to form a second gate electrode layer composed of a second remaining part of the conductive material layer;

(j) selectively removing a first lamination layer including the silicon nitride film or the silicon oxynitride film and the first silicon oxide film and a second lamination layer including the silicon nitride film or the silicon oxynitride film and the second silicon oxide film by a dry-etching process using the first and the second gate electrode layers as masks so as to remain a part of the first lamination layer under the first gate electrode layer and to remain a part of the second lamination layer under the second gate electrode layer; and (k) doping an impurity defining a conductive type that is opposite of a conductive type of the semiconductor part of the first element hole to the first element hole via the first insulating thin film by using the first gate electrode layer as a mask to form a first source region on one side of the first gate electrode layer and to form a first drain region on another side of the first gate electrode layer, and doping an impurity defining a conductive type that is opposite of a conductive type of the semiconductor part of the second element hole to the semiconductor part of the second element hole via the second insulating thin film by using the second gate electrode layer as a mask to form a second source region on one side of the second gate electrode layer and to form a second drain region on another side of the second gate electrode layer.

8. The method for manufacturing a semiconductor device according to claim 7, further comprising the steps of:

(l) doping an impurity defining a conductive type that is opposite of a conductive type of the semiconductor part of the first element hole to the semiconductor part of the first element hole via the silicon nitride film or the silicon oxynitride film and the first insulating thin film by using the first gate electrode layer as a mask to form a first low-concentration source region and a first low-concentration drain region respectively on one side and another side of the first gate electrode layer between the steps (j) and (k), the first low-concentration source region having lower impurity concentration than the first source region and the first low-concentration drain region having lower impurity concentration than the first drain region;

(m) doping an impurity defining a conductive type that is opposite of a conductive type of the semiconductor part of the second element hole to the semiconductor part of the second element hole via the silicon nitride film or the silicon oxynitride film and the second insulating thin film by using the second gate electrode layer as a mask to form a second low-concentration source region and a second low-concentration drain region respectively on one side and another side of the second gate electrode layer between the steps (j) and (k), the second low-concentration source region having lower impurity concentration than the second source region and the second low-concentration drain region having lower impurity concentration than the second drain region;

(n) forming an insulating film covering the first and the second gate electrode films on the first and the second silicon oxide films; and (o) etching back the insulating film to form a first and a second side spacers respectively composed of a first and a second remaining parts of the insulating film on the one side and another side of the first gate electrode layer and to form a third and a fourth side spacers respectively composed of a third and a fourth remaining parts of the insulating film on the one side and another side of the second gate electrode layer, and wherein the dry-etching in the step (j) is executed after the step (o), and the step (k) further uses the first and the second side spacers as masks for the ion doping to form the first source region and the first drain region and further uses the third and the fourth side spacers as masks for the ion doping to form the second source region and the second drain region.

* * * * *